(12) United States Patent
Takayama

(10) Patent No.: US 10,959,317 B1
(45) Date of Patent: Mar. 23, 2021

(54) EXTREME ULTRAVIOLET LIGHT GENERATING APPARATUS AND METHOD OF MANUFACTURING ELECTRONIC DEVICE

(71) Applicant: Gigaphoton Inc., Tochigi (JP)

(72) Inventor: Akihiro Takayama, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/938,895

(22) Filed: Jul. 24, 2020

(30) Foreign Application Priority Data

Sep. 5, 2019 (JP) .............................. JP2019-162392

(51) Int. Cl.
*H05G 2/00* (2006.01)
*G03F 7/20* (2006.01)

(52) U.S. Cl.
CPC .......... *H05G 2/003* (2013.01); *G03F 7/70033* (2013.01); *H05G 2/008* (2013.01)

(58) Field of Classification Search
CPC ..... H05G 2/003; H05G 2/008; G03F 7/70033
See application file for complete search history.

(56) References Cited

U.S. PATENT DOCUMENTS

| 9,253,866 | B2 | 2/2016 | Someya et al. | |
|---|---|---|---|---|
| 2011/0309260 | A1* | 12/2011 | Nishisaka | G03B 27/54 250/372 |
| 2012/0313016 | A1* | 12/2012 | Fleurov | H05G 2/008 250/504 R |
| 2014/0217311 | A1* | 8/2014 | Nishisaka | H05G 2/008 250/504 R |
| 2014/0306115 | A1* | 10/2014 | Kuritsyn | H05G 2/008 250/358.1 |
| 2017/0215267 | A1 | 7/2017 | Abe et al. | |
| 2017/0238407 | A1* | 8/2017 | Nagai | H05G 2/008 250/504 R |
| 2019/0364654 | A1* | 11/2019 | Ueda | H05G 2/008 |
| 2020/0124976 | A1* | 4/2020 | Patel | G03F 7/70916 |
| 2020/0314990 | A1* | 10/2020 | Chen | H05G 2/006 |

\* cited by examiner

*Primary Examiner* — Steven Whitesell Gordon
(74) *Attorney, Agent, or Firm* — Studebaker & Brackett PC

(57) ABSTRACT

An EUV light generating apparatus includes: a chamber device including an inner wall surrounding a space, and a plasma generating region in the space in which plasma is generated from a droplet irradiated with a laser beam; a heat shield including a through-hole and a channel portion, and disposed between the inner wall and the plasma generating region; a gas supply device that supplies gas; a gas introducing cylinder that is provided in the space on a side opposite to the plasma generating region, extends toward the through-hole, and introduces the gas supplied from the gas supply device through the through-hole toward the plasma generating region over the heat shield; and an optical unit optically coupled to the space through an internal space of the gas introducing cylinder and the through-hole. An entire front end surface of the gas introducing cylinder faces the heat shield.

16 Claims, 12 Drawing Sheets

EXTREME ULTRAVIOLET LIGHT GENERATING APPARATUS AND METHOD OF MANUFACTURING ELECTRONIC DEVICE

CROSS-REFERENCE TO RELATED APPLICATIONS

This application claims the benefit of Japanese Patent Application No. 2019-162392, filed on Sep. 5, 2019, the entire contents of which are hereby incorporated by reference.

BACKGROUND

1. Technical Field

The present disclosure relates to an extreme ultraviolet light generating apparatus and a method of manufacturing an electronic device.

2. Related Art

Recently, miniaturization of semiconductor processes has involved rapid progress of miniaturization of transfer patterns for use in photolithography of the semiconductor processes. In the next generation, microfabrication at 10 nm or less will be required. Thus, development of a semiconductor exposure apparatus is expected including a combination of an apparatus for generating extreme ultraviolet (EUV) light having a wavelength of about 13 nm and reduced projection reflection optics.

EUV light generating apparatuses being developed include a laser produced plasma (LPP) type apparatus using plasma generated by irradiating a target substance with a laser beam.

LIST OF DOCUMENTS

Patent Documents

Patent Document 1: U.S. Pat. No. 9,253,866
Patent Document 2: US Published Patent Application No. 2017/0215267

SUMMARY

An extreme ultraviolet light generating apparatus according to one aspect of the present disclosure may include: a chamber device including an inner wall surrounding a space with a low pressure atmosphere, and a plasma generating region provided in the space and in which plasma is generated from a droplet irradiated with a laser beam; a heat shield including a through-hole and a channel portion through which a cooling medium passes, and disposed between the inner wall and the plasma generating region; a gas supply device configured to supply gas; a gas introducing cylinder provided in the space on a side opposite to the plasma generating region with respect to the heat shield, extending toward the through-hole, and configured to introduce the gas supplied from the gas supply device through the through-hole closer to the plasma generating region than the heat shield; and an optical unit optically coupled to the space through an internal space of the gas introducing cylinder and the through-hole, an entire front end surface of the gas introducing cylinder being arranged to face the heat shield.

A method of manufacturing an electronic device according to one aspect of the present disclosure may include: generating, using an extreme ultraviolet light generating apparatus, plasma by irradiating a droplet with a laser beam and emitting extreme ultraviolet light generated from the plasma to an exposure apparatus; and exposing, using the exposure apparatus, a photosensitive substrate to the extreme ultraviolet light to manufacture an electronic device. The extreme ultraviolet light generating apparatus may include: a chamber device including an inner wall surrounding a space with a low pressure atmosphere, and a plasma generating region provided in the space and in which the plasma is generated from the droplet irradiated with the laser beam; a heat shield including a through-hole and a channel portion through which a cooling medium passes, and disposed between the inner wall and the plasma generating region; a gas supply device configured to supply gas; a gas introducing cylinder provided in the space on a side opposite to the plasma generating region with respect to the heat shield, extending toward the through-hole, and configured to introduce the gas supplied from the gas supply device through the through-hole closer to the plasma generating region than the heat shield; and an optical unit optically coupled to the space through an internal space of the gas introducing cylinder and the through-hole, an entire front end surface of the gas introducing cylinder being arranged to face the heat shield.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
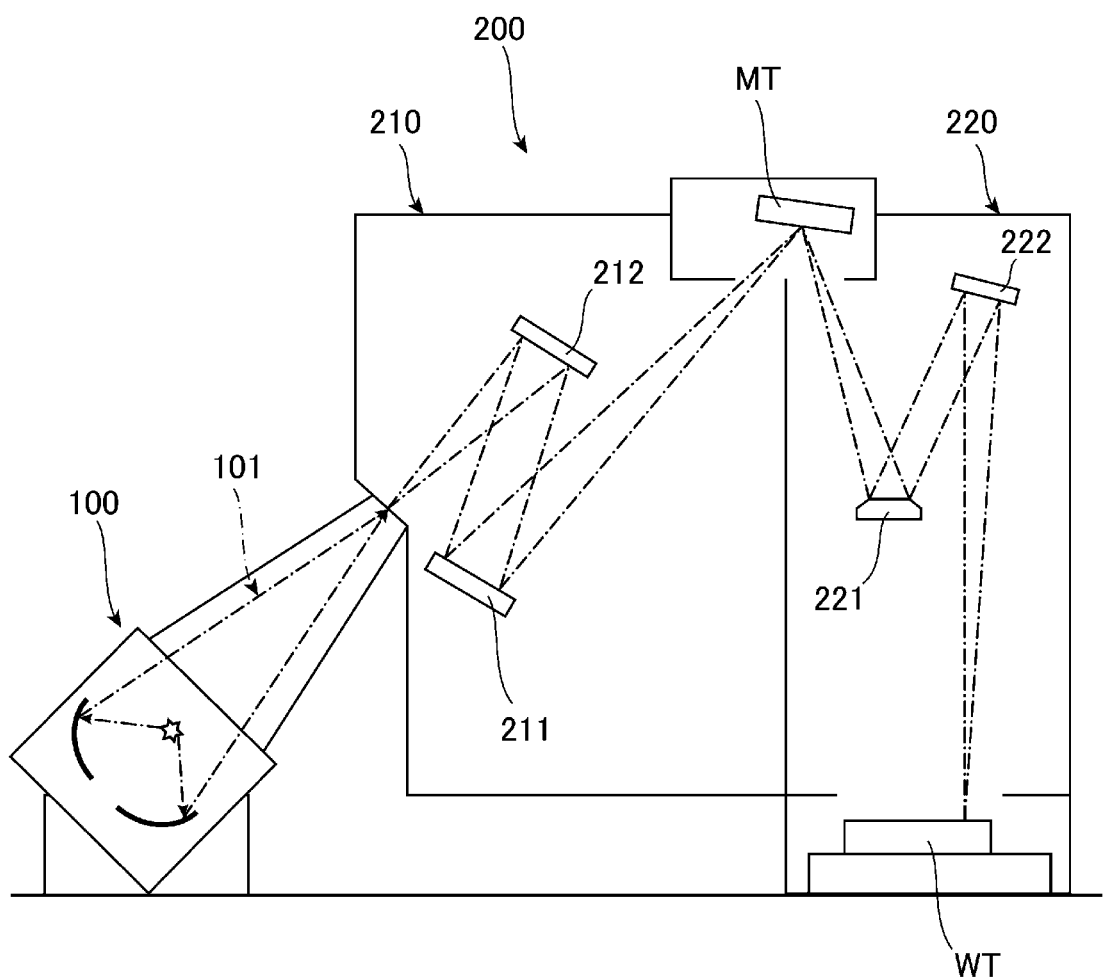
FIG. 1 shows a schematic exemplary configuration of an entire electronic device manufacturing apparatus.

1. Outline
2. Description of electronic device manufacturing apparatus

3. Description of extreme ultraviolet light generating apparatus of comparative example
   3.1 Configuration
   3.2 Operation
   3.3 Problem
4. Description of EUV light generating apparatus of Embodiment 1
   4.1 Configuration
   4.2 Effect
5. Description of EUV light generating apparatus of Embodiment 2
   5.1 Configuration
   5.2 Effect
6. Description of EUV light generating apparatus of Embodiment 3
   6.1 Configuration
   6.2 Effect Now, with reference to the drawings, embodiments of the present disclosure will be described in detail.

The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Outline

Embodiments of the present disclosure relate to an extreme ultraviolet light generating apparatus configured to generate light having a wavelength of extreme ultraviolet (EUV) light and an electronic device manufacturing apparatus. Hereinafter, the extreme ultraviolet light is sometimes referred to as EUV light.

2. Description of Electronic Device Manufacturing Apparatus

As shown in FIG. 1, an electronic device manufacturing apparatus includes an EUV light generating apparatus 100 and an exposure apparatus 200. The exposure apparatus 200 includes a mask irradiating unit 210 including a plurality of mirrors 211, 212, and a workpiece irradiating unit 220 including a plurality of mirrors 221, 222. The mask irradiating unit 210 illuminates, with EUV light 101 incident from the EUV light generating apparatus 100, a mask pattern on a mask table MT through a reflective optical system. The workpiece irradiating unit 220 forms an image of the EUV light 101 reflected by the mask table MT on a workpiece (not shown) disposed on a workpiece table WT through the reflective optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through an exposure process as described above, a device pattern is transferred onto the semiconductor wafer, thereby semiconductor device can be manufactured.

3. Description of Extreme Ultraviolet Light Generating Apparatus of Comparative Example

3.1 Configuration

Figure 2:
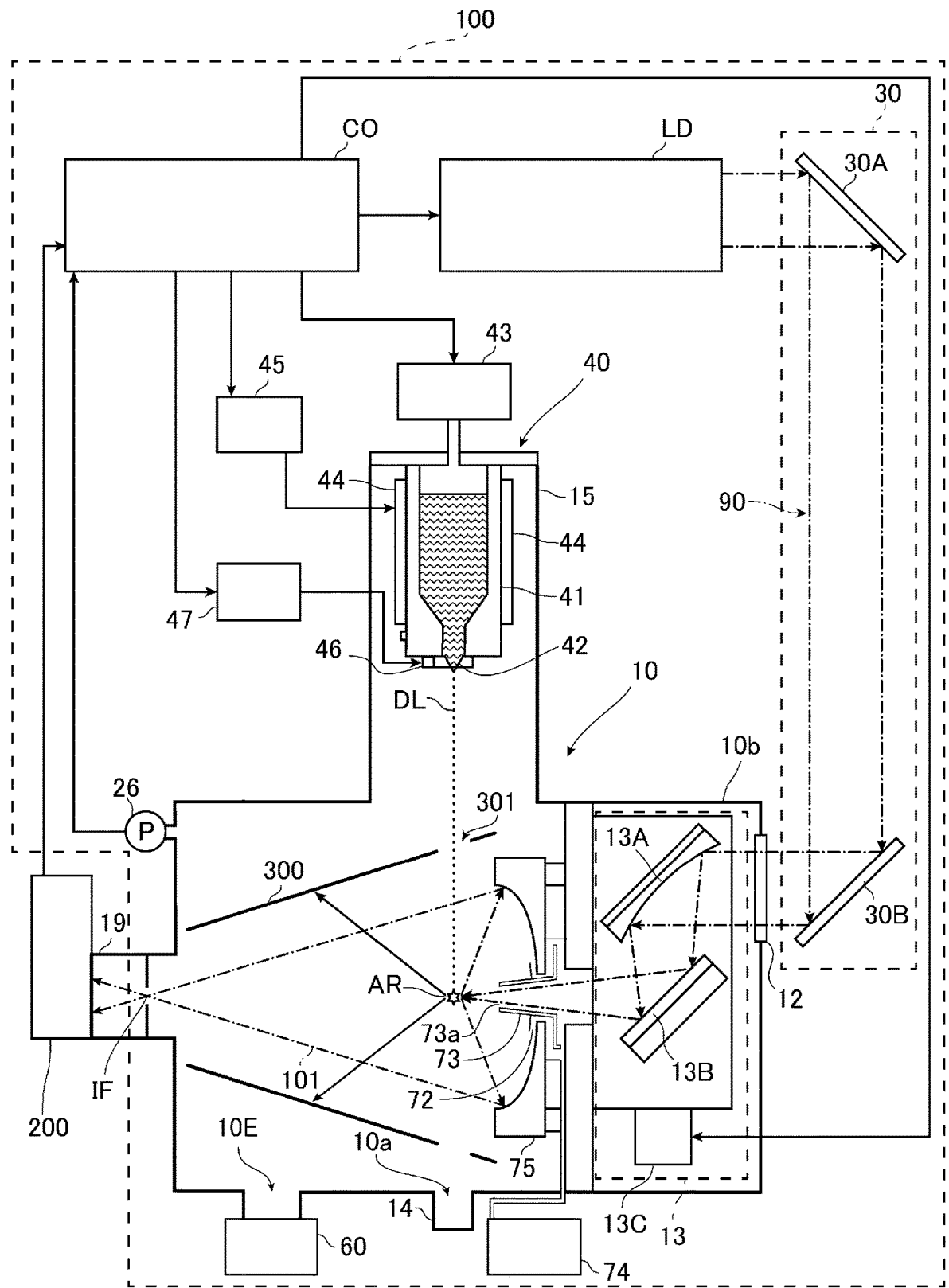
FIG. 2 shows a schematic exemplary configuration of an entire extreme ultraviolet light generating apparatus.

An EUV light generating apparatus 100 of a comparative example will be described. FIG. 2 diagrammatically shows a schematic exemplary configuration of the entire extreme ultraviolet light generating apparatus 100 of this example. As shown in FIG. 2, the EUV light generating apparatus 100 of this example mainly includes a chamber device 10, a control unit CO, a laser apparatus LD, and a laser beam delivery optical system 30.

The chamber device 10 is a sealable container. The chamber device 10 includes an inner wall 10b surrounding an internal space with a low pressure atmosphere. The chamber device 10 includes a sub chamber 15 provided with a target supply unit 40. The target supply unit 40 includes a tank 41 and a nozzle 42. The target supply unit 40 is configured to supply a droplet DL to the internal space of the chamber device 10 and is mounted, for example, to extend through a wall of the sub chamber 15. The droplet DL, which is also called a target, is supplied from the target supply unit 40.

The tank 41 stores therein a target substance to form the droplet DL. The target substance contains tin. An inside of the tank 41 communicates with, through a pipe, a pressure adjuster 43 configured to adjust gas pressure. A heater 44 is mounted to the tank 41. The heater 44 heats the tank 41 with current supplied from a heater power source 45. Through the heating, the target substance in the tank 41 melts. The pressure adjuster 43 and the heater power source 45 are electrically connected to the control unit CO.

The nozzle 42 is mounted to the tank 41 and discharges the target substance. A piezoelectric element 46 is mounted to the nozzle 42. The piezoelectric element 46 is electrically connected to a piezoelectric power source 47 and driven by voltage applied from the piezoelectric power source 47. The piezoelectric power source 47 is electrically connected to the control unit CO. The target substance discharged from the nozzle 42 is formed into the droplet DL through an operation of the piezoelectric element 46.

The chamber device 10 includes a target collecting unit 14. The target collecting unit 14 is a box mounted to the inner wall 10b of the chamber device 10. The target collecting unit 14 communicates with the internal space of the chamber device 10 through an opening 10a provided in the inner wall 10b of the chamber device 10. The target collecting unit 14 and the opening 10a are disposed directly below the nozzle 42. The target collecting unit 14 is a drain tank configured to collect any unnecessary droplet DL passing through the opening 10a and reaching the target collecting unit 14 and to accumulate the unnecessary droplet DL.

The wall of the chamber device 10 has at least one through-hole. The through-hole is blocked by a window 12 through which a pulsed laser beam 90 emitted from the laser apparatus LD passes.

A laser beam condensing optical system 13 is disposed in the chamber device 10. The laser beam condensing optical system 13 includes a laser beam condensing mirror 13A and a high reflective mirror 13B. The laser beam condensing mirror 13A reflects and condenses the laser beam 90 passing through the window 12. The high reflective mirror 13B reflects the beam condensed by the laser beam condensing mirror 13A. Positions of the laser beam condensing mirror 13A and the high reflective mirror 13B are adjusted by a laser beam manipulator 13C such that a laser beam condensing position in the chamber device 10 matches a position specified by the control unit CO.

In the chamber device 10, an EUV light condensing mirror 75 having, for example, a spheroidal reflective surface is disposed. The EUV light condensing mirror 75 has first and second focal points. The EUV light condensing mirror 75 may be disposed such that, for example, the first focal point is located in a plasma generating region AR and the second focal point is located at an intermediate focal point IF. A through-hole is provided at a center of the EUV light condensing mirror 75, and the pulsed laser beam 90 passes through the through-hole.

The EUV light generating apparatus 100 includes a connecting portion 19 configured to provide communication between the internal space of the chamber device 10 and an internal space of the exposure apparatus 200. The connecting portion 19 includes therein a wall having an aperture. The wall is preferably disposed such that the aperture is located at the second focal point of the EUV light condensing mirror 75.

The EUV light generating apparatus 100 also includes a pressure sensor 26. The pressure sensor 26 is electrically connected to the control unit CO. The pressure sensor 26 measures pressure in the internal space of the chamber device 10.

The laser apparatus LD includes a master oscillator as a light source configured to perform a burst operation. The master oscillator emits the pulsed laser beam 90 in a burst-on duration. The master oscillator is, for example, a laser apparatus configured to emit the laser beam 90 by exciting, through electric discharge, gas as mixture of carbon dioxide gas with helium, nitrogen, or the like. Alternatively, the master oscillator may be a quantum cascade laser apparatus. The master oscillator may emit the pulsed laser beam 90 by a Q switch system. The master oscillator may include a light switch, a polarizer, and the like. In the burst operation, the continuous pulsed laser beam 90 is emitted at a predetermined repetition frequency in the burst-on duration and the emission of the laser beam 90 is stopped in a burst-off duration.

A traveling direction of the laser beam 90 emitted from the laser apparatus LD is adjusted by the laser beam delivery optical system 30. The laser beam delivery optical system 30 includes a plurality of mirrors 30A and 30B for adjusting the traveling direction of the laser beam 90, and a position of at least one of the mirrors 30A and 30B is adjusted by an actuator (not shown). Through this adjustment of the position of at least one of the mirrors 30A and 30B, the laser beam 90 can appropriately propagate into the chamber device 10 through the window 12.

The control unit CO may include, for example, a micro controller, an integrated circuit (IC) such as a large-scale integrated circuit (LSI) or an application specific integrated circuit (ASIC), or a numerical control (NC) device. When the control unit CO is the NC device, the control unit CO may or may not include a machine learning device. The control unit CO is configured to control the entire EUV light generating apparatus 100 and also controls the laser apparatus LD. The control unit CO receives a signal related to the pressure in the internal space of the chamber device 10, which is measured by the pressure sensor 26, a signal related to image data of the droplet DL captured by an optical unit 700 described later, a burst signal from the exposure apparatus 200, and the like. The control unit CO is configured to process the image data and the like and to control output timing of the droplet DL, an output direction of the droplet DL, and the like. Such various kinds of control are merely exemplary and different control may be added as described later.

Next, a configuration of the chamber device 10 will be described in more detail.

Figure 3:
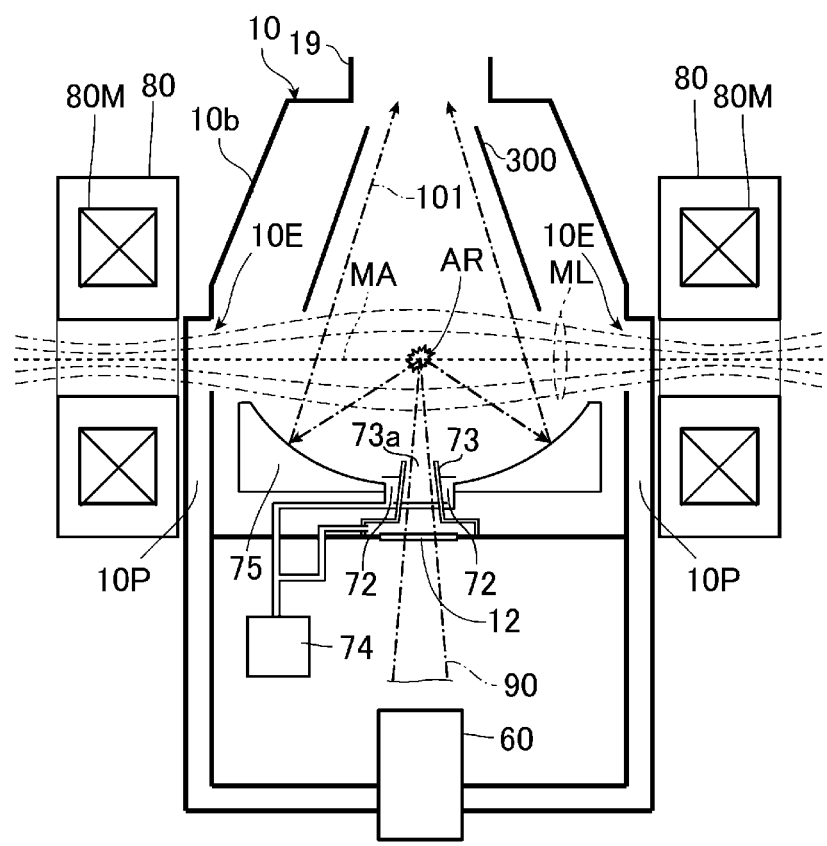
FIG. 3 shows a partial schematic exemplary configuration including a chamber device.

FIG. 3 diagrammatically shows a partial schematic exemplary configuration including the chamber device 10. In FIG. 3, the laser beam condensing optical system 13 is omitted. As shown in FIGS. 2 and 3, in the chamber device 10, a first gas supply unit 72 and a second gas supply unit 73 configured to supply etching gas to the internal space of the chamber device 10 are disposed. The first gas supply unit 72 and the second gas supply unit 73 are connected to a gas supply device 74 as a tank configured to supply etching gas through pipes. Since the target substance contains tin as described above, the etching gas is, for example, hydrogen-containing gas having a hydrogen gas concentration of almost 100%. Alternatively, the etching gas may be, for example, balance gas having a hydrogen gas concentration of about 3%. The balance gas may contain nitrogen ($N_2$) gas or argon (Ar) gas. The pipe between the gas supply device 74 and at least one of the first gas supply unit 72 and the second gas supply unit 73 may include a supply gas flow rate adjusting unit (not shown).

The first gas supply unit 72 is adjusted such that the etching gas supplied into the chamber device 10 flows along a reflective surface from a central axis side of the EUV light condensing mirror 75 toward an outer peripheral portion of the EUV light condensing mirror 75. The second gas supply unit 73 has a truncated conical shape and is sometimes called cone. A gas supply port 73a of the second gas supply unit 73 is inserted into a through-hole formed in the EUV light condensing mirror 75, and the gas supply port 73a supplies the etching gas through the through-hole in a direction away from the EUV light condensing mirror 75. The laser beam 90 passes through the through-hole in the EUV light condensing mirror 75 as described above through the second gas supply unit 73. Thus, the laser beam 90 can pass through the second gas supply unit 73 on a side of the window 12.

Tin fine particles and tin charged particles are generated when the target substance forming the droplet DL is turned into plasma in the plasma generating region AR. The etching gas supplied from the first gas supply unit 72 and the second gas supply unit 73 contains hydrogen that reacts with tin contained in these fine particles and charged particles. Through the reaction with hydrogen, tin becomes stannane ($SnH_4$) gas at room temperature.

The EUV light generating apparatus 100 includes a magnetic field generating unit 80. The magnetic field generating unit 80 generates a magnetic field ML for converging the charged particles generated in the plasma generating region AR to an exhaust port 10E. The magnetic field generating unit 80 may include, for example, a pair of electromagnets 80M disposed to sandwich walls of the chamber device 10 facing each other. The electromagnets 80M are disposed such that the plasma generating region AR is located at the middle of the electromagnets 80M. A direction of current flowing through a superconductive coil of one of the electromagnets 80M is the same as a direction of current flowing through a superconductive coil of the other electromagnet 80M. When such current is applied to the pair of superconductive coils, the magnetic field ML is generated at a magnetic flux density that is highest near each electromagnet 80M and decreases toward the plasma generating region AR. A magnetic field axis MA of the magnetic field ML preferably passes across a reflected optical path of the EUV light condensing mirror 75 and passes through the plasma generating region AR. The magnetic field ML is sometimes called a mirror magnetic field.

The magnetic field generating unit 80 may be configured to generate a magnetic field for converging the charged particles from one of the electromagnets 80M to the other electromagnet 80M through the plasma generating region AR. The magnetic field generating unit 80 includes the electromagnets 80M, but may include a pair of permanent magnets. The electromagnets 80M or permanent magnets for generating a magnetic field may be disposed inside the chamber device 10.

The chamber device 10 includes a pair of exhaust ports 10E. The exhaust ports 10E exhaust residual gas described later in the internal space of the chamber device 10. The exhaust ports 10E are disposed, for example, to face each other in the inner wall 10b of the chamber device 10. The exhaust ports 10E face each other along the magnetic field axis MA and are disposed in positions through which the magnetic field axis MA passes in the chamber device 10. The exhaust ports 10E are connected to exhaust pipes 10P, which are connected to an exhaust pump 60.

When the target substance is turned into plasma, residual gas as exhaust gas is generated in the internal space of the chamber device 10. The residual gas contains tin fine particles and charged particles generated through the target substance being turned into plasma, stannane generated through reaction of the tin fine particles and the charged particles with the etching gas, and unreacted etching gas. Some of the charged particles are neutralized in the chamber device 10, and the residual gas contains the neutralized charged particles. The exhaust pump 60 sucks the residual gas through the exhaust ports 10E and the exhaust pipes 10P.

As shown in FIG. 2, the chamber device 10 further includes a heat shield 300 disposed in the internal space of the chamber device 10. The heat shield 300 is made of, for example, metal such as aluminum.

For example, the heat shield 300 has a cylindrical shape and is disposed between the inner wall 10b of the chamber device 10 and the plasma generating region AR. For example, the heat shield 300 is disposed between the plasma generating region AR and the target collecting unit 14, and between the plasma generating region AR and the nozzle 42.

The heat shield 300 houses the plasma generating region AR. The heat shield 300 is irradiated with light generated from plasma, which is generated by the droplet DL being irradiated with the laser beam 90. The heat shield 300 rather than the inner wall 10b of the chamber device 10 is irradiated with the light, thereby preventing thermal deformation of the inner wall 10b of the chamber device 10 due to the light. The light includes, for example, at least one of emitted light incidentally emitted from the plasma along with generation of the plasma, and scattered light as the laser beam 90 that is scattered by the target substance. This light may include EUV light.

The heat shield 300 is secured to the inner wall 10b of the chamber device 10 through a damper (not shown). The damper is made of a structural material that prevents expansion and deformation stress due to heat from the heat shield 300 from being transferred to the inner wall 10b of the chamber device 10.

The heat shield 300 includes a pair of passage holes 301 provided on a traveling path of the droplet DL. The droplet DL passes through the passage hole 301.

Figure 4:
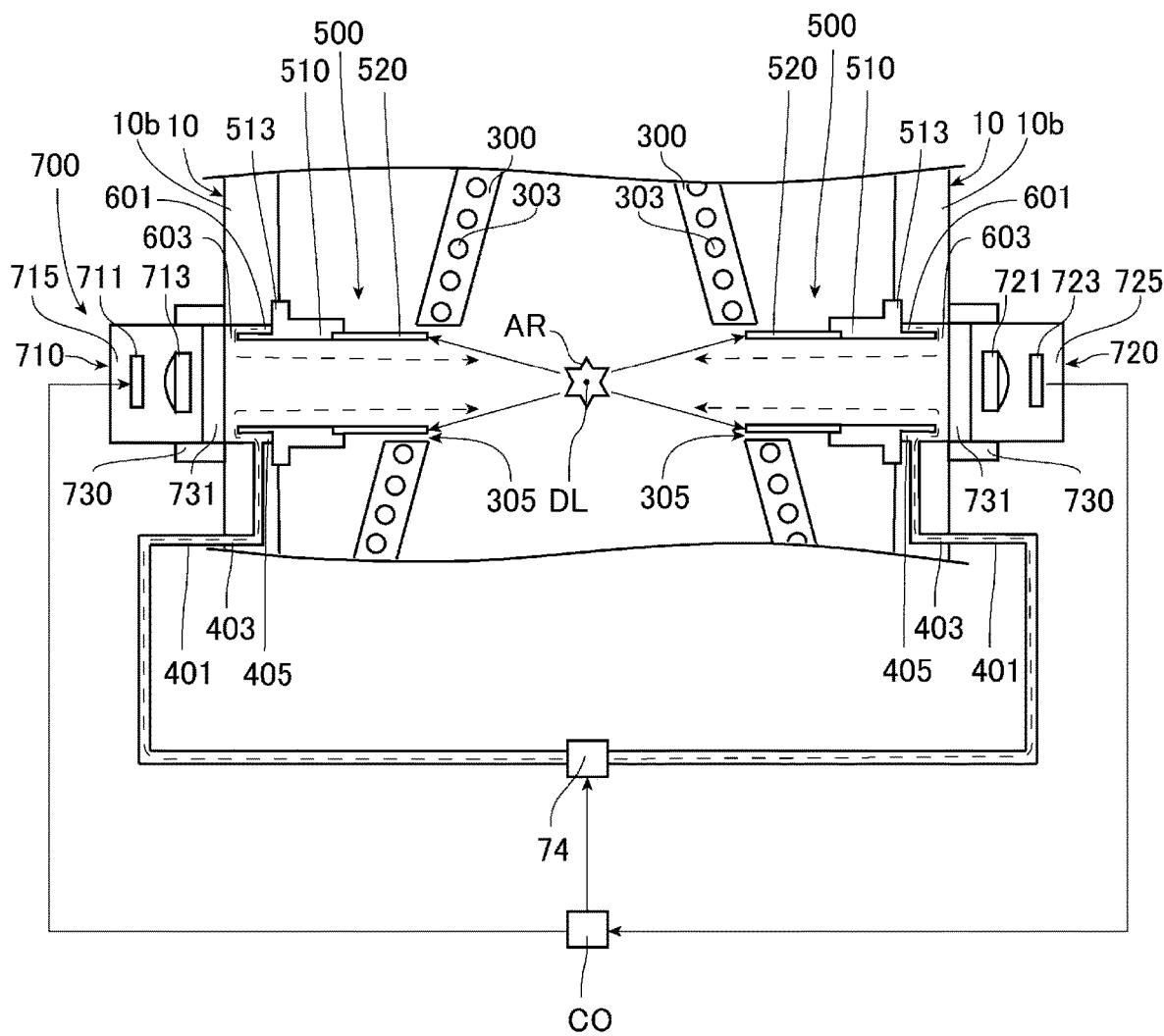
FIG. 4 diagrammatically shows a light source unit and a detecting unit sandwiching a plasma generating region through a heat shield in a comparative example.
Figure 5:
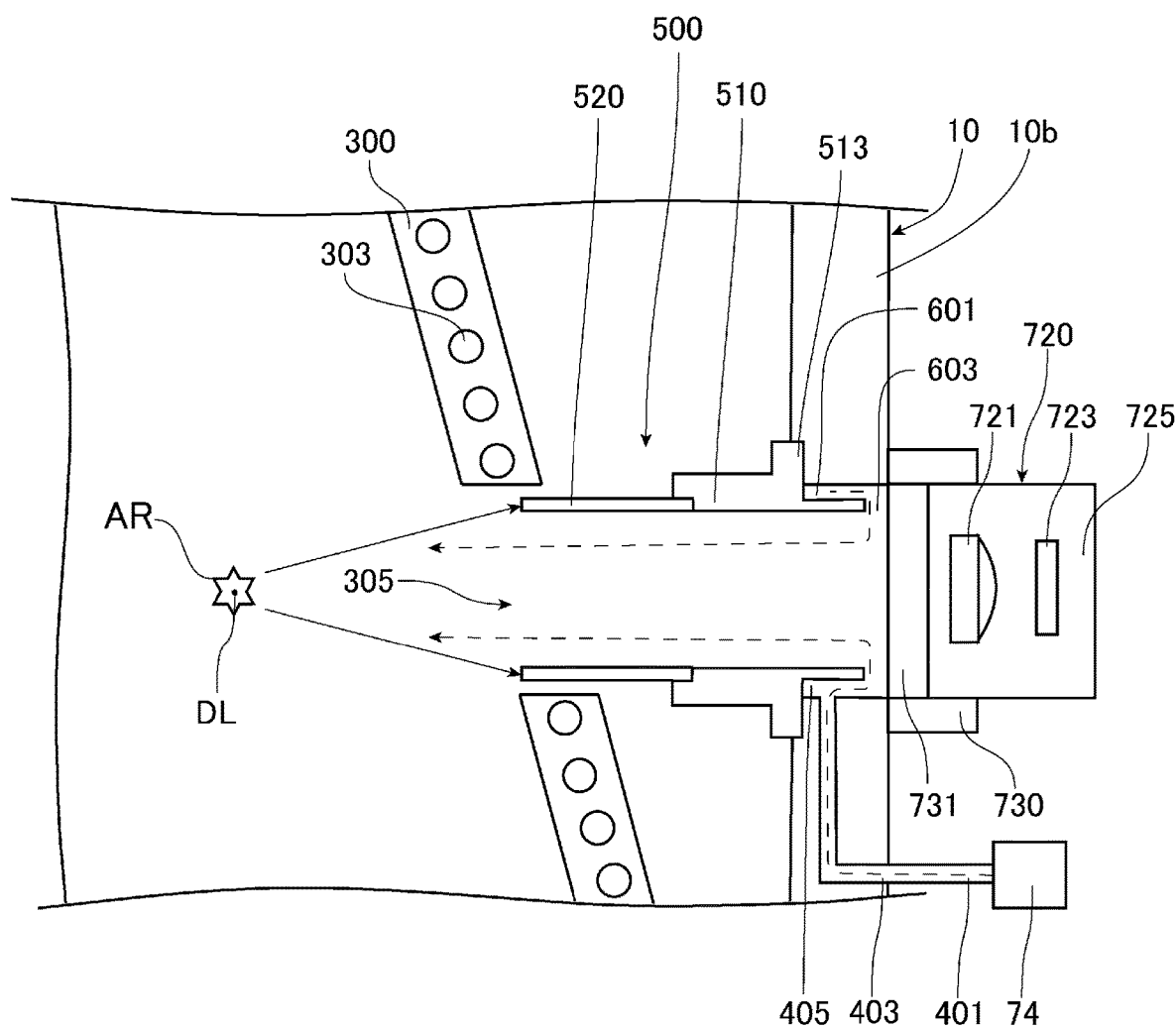
FIG. 5 is an enlarged view of the heat shield, a gas introducing cylinder, the detecting unit, and the surroundings in FIG. 4.

FIG. 4 diagrammatically shows a light source unit 710 and a detecting unit 720 sandwiching the plasma generating region AR through the heat shield 300 in the comparative example. FIG. 5 is an enlarged view of the heat shield 300, a gas introducing cylinder 500, the detecting unit 720, and the surroundings in FIG. 4. In FIG. 5, the control unit CO is not shown.

The heat shield 300 further includes a channel portion 303 and a plurality of through-holes 305.

The channel portion 303 is a hole provided in a wall of the heat shield 300 other than the passage hole 301 and the through-holes 305. A cooling medium flows through the channel portion 303. The cooling medium prevents thermal deformation of the heat shield 300 due to the light including at least one of the emitted light and the scattered light. For example, the cooling medium is water at a temperature of 5° C.

The through-holes 305 provide communication between the inside and outside of the heat shield 300. The through-holes 305 are provided in positions different from the passage hole 301 in the wall of the heat shield 300. One through-hole 305 is provided to face the other through-hole 305 in a radial direction of the heat shield 300. For example, the through-holes 305 are provided at regular intervals in a longitudinal direction of the heat shield 300.

The EUV light generating apparatus 100 includes a pipe 401 connected to the gas supply device 74.

The pipe 401 extends from the gas supply device 74 toward the inner wall 10b of the chamber device 10. The pipe 401 may include a supply gas flow rate adjustor (not shown).

The inner wall 10b of the chamber device 10 includes a connecting hole 403 and a through-hole 405. The connecting hole 403 is provided in the inner wall 10b, and the through-hole 405 extends through the inner wall 10b of the chamber device 10. The connecting hole 403 is connected to the pipe 401 through an opening provided at one end of the connecting hole 403. The connecting hole 403 is connected to the through-hole 405 through an opening provided at the other end of the connecting hole 403. A central axis of the through-hole 405 is coaxial with a central axis of the through-hole 305 in the heat shield 300.

The EUV light generating apparatus 100 includes the gas introducing cylinder 500 provided in the internal space of the chamber device 10 on a side opposite to the plasma generating region AR with respect to the heat shield 300. The gas introducing cylinder 500 includes a first cylinder 510 mounted to the inner wall 10b of the chamber device 10, and a second cylinder 520 connected to the first cylinder 510. The first cylinder 510 and the second cylinder 520 are made of, for example, metal such as aluminum.

An outer diameter of a base end of the first cylinder 510 is smaller than a diameter of the through-hole 405, and the base end of the first cylinder 510 is provided in the through-hole 405. The first cylinder 510 is provided in the through-hole 405 such that a central axis of the first cylinder 510 is coaxial with the central axis of the through-hole 405 and the central axis of the through-hole 305 in the heat shield 300. A ring-like first gap 601 is provided between an outer peripheral surface of the base end of the first cylinder 510 and a peripheral surface of the through-hole 405. The first gap 601 communicates with the connecting hole 403. The first gap 601 has a constant size in a circumferential direction of the first cylinder 510. An entire base end surface of the first cylinder 510 is disposed apart from a window 731 described later in a longitudinal direction of the first cylinder 510. A second gap 603 is provided between the base end surface and the window 731. The second gap 603 communicates with the first gap 601 and an internal space of the first cylinder 510.

The first cylinder 510 is secured to the inner wall 10b of the chamber device 10 through a flange 513 disposed on an outer peripheral surface of the first cylinder 510. The flange 513 closes one end of the through-hole 405.

A base end of the second cylinder 520 is fitted into an inner groove at a front end of the first cylinder 510 and connected to the front end of the first cylinder 510. Thus, the second cylinder 520 communicates with the first cylinder 510. An inner diameter of the second cylinder 520 is equal to an inner diameter of the first cylinder 510.

A front end of the second cylinder 520 extends toward the through-hole 305 in the heat shield 300. An outer diameter of the second cylinder 520 is smaller than a diameter of the through-hole 305, and the second cylinder 520 is inserted into the through-hole 305. An outer peripheral surface of the second cylinder 520 is disposed apart from a peripheral surface of the through-hole 305.

The pipe 401, the connecting hole 403, the first gap 601, the second gap 603, the internal space of the first cylinder 510, and the internal space of the second cylinder 520 form a channel for etching gas supplied from the gas supply device 74 and flowing through the pipe 401 toward the through-hole 305. The gas introducing cylinder 500 receives the etching gas supplied from the gas supply device 74 through the pipe 401, the connecting hole 403, the first gap 601, and the second gap 603. The gas introducing cylinder 500 introduces the supplied etching gas through the through-hole 305 toward the plasma generating region AR over the heat shield 300. The etching gas flows away from the window 731, that is, flows from the internal space of the first cylinder 510 through the internal space of the second cylinder 520 toward the through-hole 305 in the gas introducing cylinder 500.

The EUV light generating apparatus 100 includes the optical unit 700.

For example, the optical unit 700 includes a light source unit 710 configured to emit light toward the droplet DL, and a detecting unit 720 configured to detect the light emitted from the light source unit 710. The light source unit 710 and the detecting unit 720 are electrically connected to the control unit CO.

The light source unit 710 is disposed on a side opposite to the detecting unit 720 with respect to the traveling path of the droplet DL traveling from the nozzle 42 to the target collecting unit 14. Specifically, the light source unit 710 and the detecting unit 720 are arranged to face each other with the traveling path of the droplet DL therebetween.

The light source unit 710 is held by a holder 730 mounted to the inner wall 10b of the chamber device 10. The light source unit 710 is disposed coaxially with the window 731 outside the inner wall 10b of the chamber device 10. The window 731 may be, for example, a circular parallel plane substrate. Alternatively, the window 731 may be a circular wedge substrate. The window 731 is disposed in the holder 730 between the light source unit 710 and the traveling path of the droplet DL. The window 731 is disposed coaxially with the through-hole 405 and closes the other end of the through-hole 405. The detecting unit 720 is held by a holder 730 like the light source unit 710.

The light source unit 710 includes a light source 711, an illumination optical system 713 configured to condense light emitted from the light source 711 through the window 731 onto the traveling path of the droplet DL, and a container 715 housing the light source 711 and the illumination optical system 713. For example, the light source 711 may emit a monochromatic laser beam, or may be a flush lamp configured to emit light having a plurality of wavelengths. The illumination optical system 713 includes, for example, a collimate lens. The light source unit 710 may include an optical fiber for guiding the light emitted from the light source 711 to the illumination optical system 713.

The detecting unit 720 includes a light receiving optical system 721, a light receiving unit 723, and a container 725 housing the light receiving optical system 721 and the light receiving unit 723. To increase detection accuracy of the droplet DL, the light receiving optical system 721 forms, on the light receiving unit 723, an image of the droplet DL on the traveling path and the surroundings. The light receiving optical system 721 includes, for example, a light condensing lens. When the droplet DL passes through a light condensing region by the light source unit 710, the light receiving unit 723 detects a change in light passing through the traveling path of the droplet DL and the surroundings. The light receiving unit 723 converts the detected change in light into an electric signal as a signal related to optical data of the droplet DL. The light receiving unit 723 outputs the electric signal to the control unit CO. The light receiving unit 723 may include, for example, a charge-coupled device (CCD), a photodiode, a photodiode array, an avalanche photodiode, a photomultiplier, a multipixel photon counter, an image intensifier, or the like.

The light source unit 710 and the detecting unit 720 are optically coupled to the internal space of the chamber device 10 through the window 731, the internal space of the first cylinder 510, the internal space of the second cylinder 520, and the through-hole 305 in the heat shield 300. For example, the light source unit 710 and the detecting unit 720 are configured to observe the presence, traveling path, position, speed, and the like of the droplet DL through the window 731, the internal space of the first cylinder 510, the internal space of the second cylinder 520, and the through-hole 305 in the heat shield 300.

Figure 6:
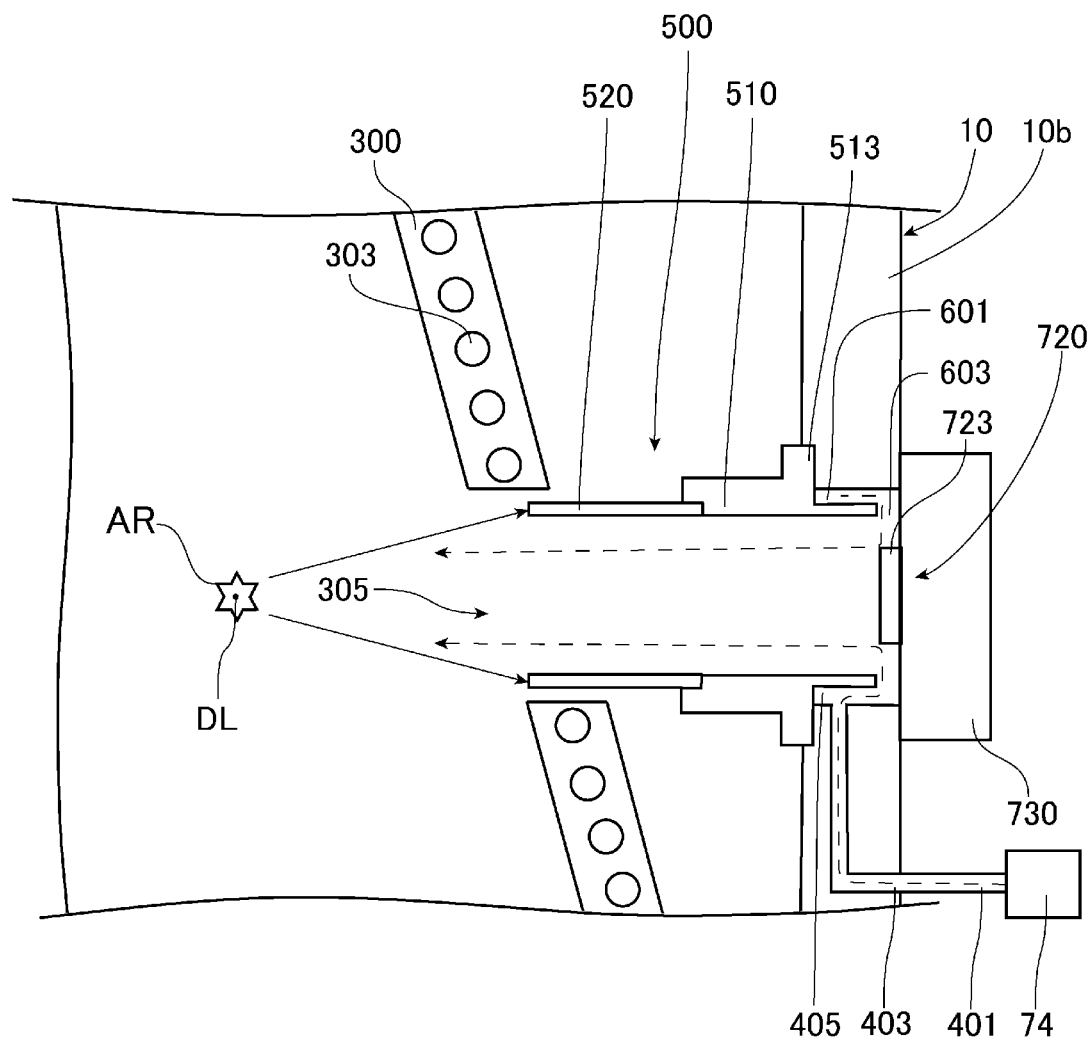
FIG. 6 shows an example of arrangement of the detecting unit in FIG. 5.

The detecting unit 720 need only detect at least one of the droplet DL and the plasma. When the detecting unit 720 detects the droplet DL, as described above, the light receiving unit 723 is disposed coaxially with the window 731 outside the inner wall 10b of the chamber device 10. When the detecting unit 720 detects the plasma, as shown in FIG. 6, the light receiving unit 723 held by the holder 730 is provided in the through-hole 405 inside the inner wall 10b of the chamber device 10. The holder 730 closes the other end of the through-hole 405. In this case, the detecting unit 720 may detect EUV light. Like the light receiving unit 723, the light source 711 held by the holder 730 may be provided in the through-hole 405 inside the inner wall 10b of the chamber device 10.

As described above, the through-holes 305 in the heat shield 300 are provided at regular intervals in the longitudinal direction of the heat shield 300. Along with the arrangement of the through-holes 305, the pipe 401, the connecting hole 403, the through-hole 405, the gas introducing cylinder 500, and the optical unit 700 are disposed correspondingly to the through-holes 305.

3.2 Operation

Next, an operation of the EUV light generating apparatus 100 of the comparative example will be described. In the EUV light generating apparatus 100, an atmosphere in the chamber device 10 is exhausted, for example, at new installation or maintenance. In this process, purge and exhaust may be repeated in the chamber device 10 to exhaust components in the atmosphere. Purge gas is preferably inert gas such as nitrogen ($N_2$) or argon (Ar). Then, when the pressure in the chamber device 10 becomes equal to or lower than predetermined pressure, the control unit CO starts introduction of the etching gas from the gas supply device 74 through the first gas supply unit 72 and the second gas supply unit 73 into the chamber device 10. In this case, the control unit CO may control the supply gas flow rate adjustor (not shown) and the exhaust pump 60 such that the pressure in the internal space of the chamber device 10 is maintained at the predetermined pressure. Then, the control unit CO waits until a predetermined time elapses since the start of the etching gas introduction.

The control unit CO drives the electromagnets 80M of the magnetic field generating unit 80 to generate the magnetic field ML. The control unit CO controls the exhaust pump 60 to exhaust gas in the chamber device 10 through the exhaust ports 10E, and maintains substantially constant pressure in the chamber device 10 based on a signal of the pressure in the chamber device 10 measured by the pressure sensor 26.

The control unit CO applies current from the heater power source 45 to the heater 44 to increase the temperature of the heater 44 so that the target substance in the tank 41 is heated to or maintained at a predetermined temperature equal to or higher than a melting point. In this case, the control unit CO controls the temperature of the target substance to the predetermined temperature by adjusting a value of current applied from the heater power source 45 to the heater 44 based on an output from a temperature sensor (not shown). The predetermined temperature is, for example, 250° C. to 290° C. when the target substance is tin.

The control unit CO controls the pressure adjuster 43 to adjust pressure in the tank 41 such that the melted target substance is discharged through the hole of the nozzle 42 at a predetermined speed. The target substance discharged through the hole of the nozzle 42 may be in the form of jet. In this case, the control unit CO generates the droplet DL by applying voltage having a predetermined waveform from the piezoelectric power source 47 to the piezoelectric element 46. Vibration of the piezoelectric element 46 can propagate through the nozzle 42 to the target substance discharged through the hole of the nozzle 42. The target substance is divided at a predetermined cycle by the vibration, and the droplet DL is generated from the target substance.

The control unit CO outputs a light emission trigger signal to the laser apparatus LD. Having received the light emission trigger signal, the laser apparatus LD emits the pulsed laser beam 90. The emitted laser beam 90 is incident on the laser beam condensing optical system 13 through the laser beam delivery optical system 30 and the window 12. In this case, the control unit CO controls the laser beam manipulator 13C of the laser beam condensing optical system 13 such that the laser beam 90 condenses in the plasma generating region AR. The control unit CO controls the laser apparatus LD to emit the laser beam 90 based on the signal from the optical unit 700 such that the droplet DL is irradiated with the laser beam 90. Thus, the droplet DL is irradiated in the plasma generating region AR with the laser beam 90 converged by the laser beam condensing mirror 13A. Plasma generated through the irradiation radiates light including EUV light.

Among the light generated in the plasma generating region AR and including EUV light, the EUV light 101 is condensed on the intermediate focal point IF by the EUV light condensing mirror 75 and then incident on the exposure apparatus 200 through the connecting portion 19. Thus, the connecting portion 19 is an emission port of the EUV light 101 in the EUV light generating apparatus 100.

When the target substance is turned into plasma, tin charged particles are generated as described above. Each charged particle receives Lorentz force from the magnetic field ML and moves on a trajectory that rotates in a plane perpendicular to a magnetic field line. When the charged particle moving in this manner has a speed component in a direction toward one of the exhaust ports 10E, the charged particle moves toward the wall of the chamber device 10 while converging on a helical trajectory along the magnetic field line. Thus, most of the charged particles are induced to the exhaust ports 10E provided in the wall of the chamber device 10 near converging portions of the magnetic field ML and flow into the exhaust ports 10E.

When the target substance is turned into plasma, tin fine particles that are electrically neutral are generated as described above. The fine particles are not affected by the magnetic field ML generated by the magnetic field generating unit 80 and thus diffuse in the chamber device 10. Some of the fine particles diffusing in the chamber device 10 adhere to the reflective surface of the EUV light condensing mirror 75. The fine particles adhering to the reflective surface become stannane through reaction with the etching gas containing hydrogen supplied from the first gas supply unit 72 and the second gas supply unit 73. Most of the stannane obtained through the reaction with the etching gas flows into the exhaust ports 10E on flow of unreacted etching gas.

At least part of charged particles not converged to the exhaust ports 10E by the magnetic field ML and fine particles not adhering to the reflective surface of the EUV light condensing mirror 75 may become stannane through reaction with part of unreacted etching gas flowing in the chamber device 10. Most of the stannane generated through the reaction flows into the exhaust ports 10E on flow of unreacted etching gas. At least part of unreacted charged particles, fine particles, and etching gas flow into the exhaust ports 10E.

The unreacted etching gas, fine particles, charged particles, stannane, and the like having flowed into the exhaust ports 10E flow as residual gas through the exhaust pipes 10P into the exhaust pump 60 and are subjected to predetermined exhaust treatment such as detoxification.

As described above, when the droplet DL is irradiated with the laser beam 90 to generate plasma in the plasma generating region AR, light other than the EUV light is generated from the plasma as well. This light includes, for example, at least one of the emitted light and the scattered light. The heat shield 300 is irradiated with this light. This prevents the inner wall 10b of the chamber device 10 from being irradiated with light, thereby preventing thermal deformation of the inner wall 10b of the chamber device 10 due to light. Also, the heat shield 300 is cooled by the cooling medium flowing through the channel portion 303, and the cooling medium prevents thermal deformation of the heat shield 300 due to light.

The residual gas in the internal space of the chamber device 10 is about to enter the internal space of the second cylinder 520 and the internal space of the first cylinder 510 through the through-hole 305 in the heat shield 300 and to travel to the window 731.

In the comparative example, as described above, the control unit CO starts introduction of the etching gas from the gas supply device 74 through the first gas supply unit 72 and the second gas supply unit 73 into the chamber device 10. Simultaneously with the start of the introduction, the control unit CO further starts introduction of the etching gas from the gas supply device 74 through the pipe 401, the connecting hole 403, the first gap 601, and the second gap 603 into the gas introducing cylinder 500. The etching gas is supplied from the gas supply device 74 through the pipe 401, the connecting hole 403, the first gap 601, and the second gap 603 into the gas introducing cylinder 500. The etching gas is also supplied through the internal spaces of the first cylinder 510 and the second cylinder 520 of the gas introducing cylinder 500 and the through-hole 305 toward the plasma generating region AR. The etching gas supplied to the internal space of the first cylinder 510 flows away from the window 731, that is, flows through the internal space of the second cylinder 520 toward the through-hole 305. This flow of the etching gas prevents the residual gas from entering the internal space of the second cylinder 520 and the internal space of the first cylinder 510 through the through-hole 305 in the heat shield 300. Even if the residual gas enters the internal spaces, the flow of the etching gas prevents the residual gas from traveling to the window 731.

In the internal space of the chamber device 10, tin may be deposited from the residual gas heated by the light generated from plasma. Specifically, part of stannane contained in the residual gas may return to tin through heating. If tin is deposited from the residual gas in the internal space of the first cylinder 510 and the internal space of the second cylinder 520, and the tin accumulates on an inner peripheral surface of the first cylinder 510, an inner peripheral surface of the second cylinder 520, and the window 731, the accumulating tin may interfere with observation by the optical unit 700. However, in the comparative example, as described above, the residual gas is prevented from entering the internal spaces, thereby preventing accumulation of tin and preventing interference of observation due to tin. The etching gas dilutes the residual gas, and the dilution prevents deposition of tin. This further prevents accumulation of tin on the inner peripheral surface of the first cylinder 510, the inner peripheral surface of the second cylinder 520, and the window 731, thereby further preventing interference of observation due to tin.

The heat shield 300 is cooled by the cooling medium. In this case, in the through-hole 305 in the heat shield 300, deposition of tin from the residual gas is prevented, thereby preventing accumulation of tin on the peripheral surface of the through-hole 305. This prevents interference of observation due to tin. When accumulating tin falls through the through-hole 305, structures in the chamber device 10 such as the EUV light condensing mirror 75 may be contaminated with the falling tin. However, in the comparative example, accumulation of tin is prevented, thereby preventing contamination of the structures in the chamber device 10 with the falling tin.

In this state, the light source unit 710 emits light toward the droplet DL through the window 731, the internal space of the first cylinder 510, the internal space of the second cylinder 520, and the through-hole 305 in the heat shield 300. The detecting unit 720 detects the light emitted from the light source unit 710 through the through-hole 305 in the heat shield 300, the internal space of the second cylinder 520, the internal space of the first cylinder 510, and the window 731. The optical unit 700 observes the presence, traveling path, position, speed, and the like of the droplet DL with interference of observation being prevented.

3.3 Problem

In the chamber device 10 of the comparative example, for example as shown in FIG. 5, the front end of the gas introducing cylinder 500 is inserted into the through-hole 305 in the heat shield 300, and is thus directly irradiated with part of the light generated from plasma. Thus, the front end of the gas introducing cylinder 500 is heated by the light and is increased in temperature. In this case, tin is deposited from the residual gas heated by the light at the front end of the gas introducing cylinder 500, and may accumulate on the front end of the gas introducing cylinder 500. Thus, the accumulating tin may interfere with observation by the optical unit 700. When the accumulating tin falls from the front end of the gas introducing cylinder 500, the structures in the chamber device 10 may be contaminated with the falling tin. Such interference of observation and contamination of the structures in the chamber device 10 may cause a fault in the chamber device 10. Thus, it is desirable to prevent the gas introducing cylinder 500 from being irradiated with the light generated from plasma and to thus prevent occurrence of a fault in the chamber device 10 due to accumulating tin.

Then, in the following embodiments, an EUV light generating apparatus 100 is exemplified which can prevent a gas introducing cylinder 500 from being irradiated with light generated from plasma and thus prevent occurrence of a fault in a chamber device 10 due to accumulating tin.

4. Description of EUV Light Generating Apparatus of Embodiment 1

Next, a configuration of an EUV light generating apparatus 100 of Embodiment 1 will be described. Components similar to those described above are denoted by the same reference numerals, and overlapping descriptions are omitted unless otherwise stated.

4.1 Configuration

Figure 7:
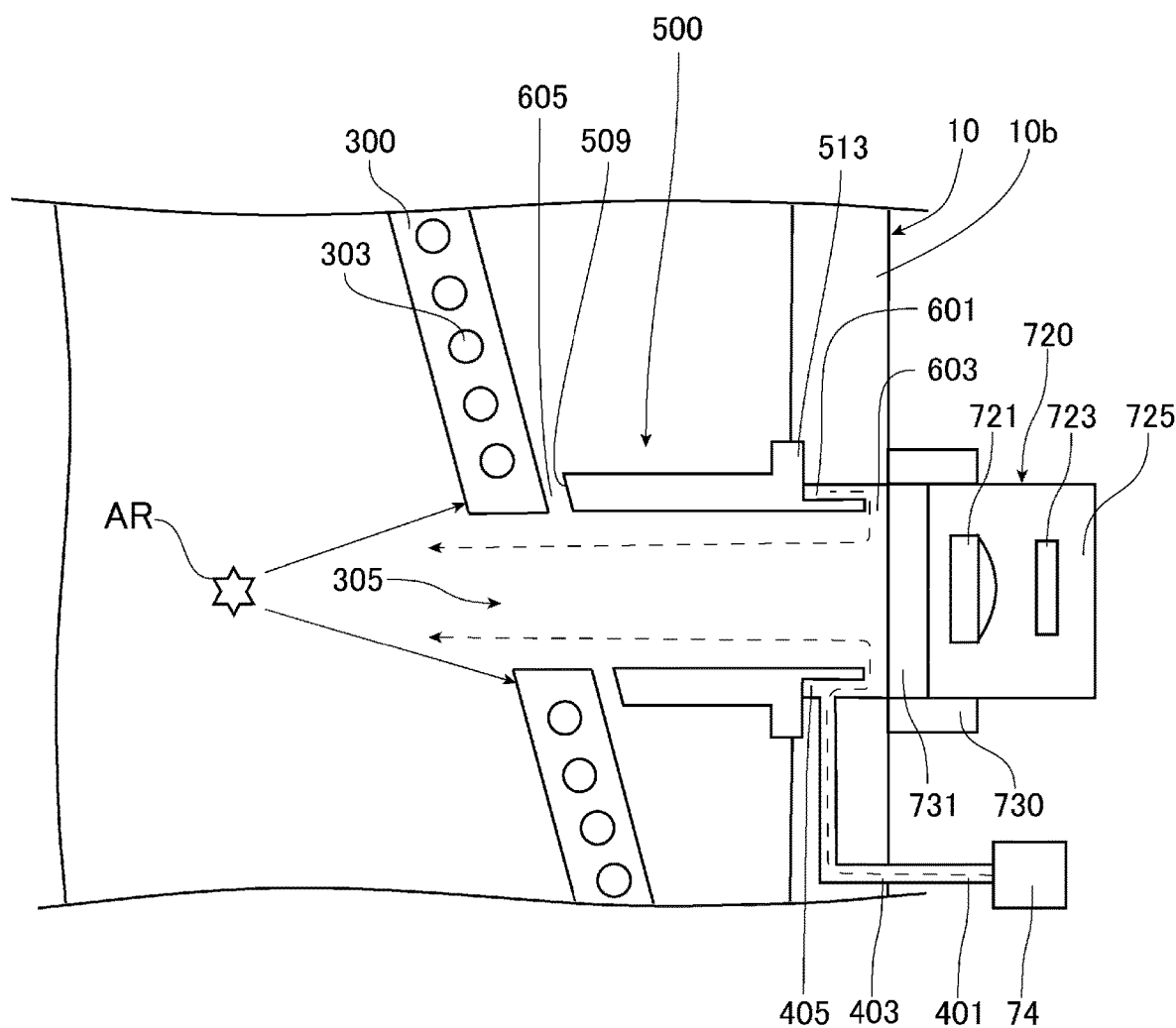
FIG. 7 is an enlarged view of a heat shield, a gas introducing cylinder, a detecting unit, and the surroundings in Embodiment 1.

FIG. 7 is an enlarged view of a heat shield 300, a gas introducing cylinder 500, a detecting unit 720, and the surroundings in this embodiment. In FIG. 7, a control unit CO is not shown as in FIG. 5. In a chamber device 10 of this embodiment, a configuration of the gas introducing cylinder 500 is mainly different from the configuration of the gas introducing cylinder 500 of the comparative example. The gas introducing cylinder 500 of the comparative example includes the two cylinders, the first cylinder 510 and the second cylinder 520, while the gas introducing cylinder 500 of this embodiment includes only one cylinder.

The gas introducing cylinder 500 is provided in an internal space of the chamber device 10 on a side opposite to a plasma generating region AR with respect to the heat shield 300. The gas introducing cylinder 500 is disposed such that a central axis of the gas introducing cylinder 500 is coaxial with a central axis of a window 731. The gas introducing cylinder 500 is made of, for example, metal such as aluminum.

An outer diameter of a base end of the gas introducing cylinder 500 is smaller than a diameter of a through-hole 405, and the base end of the gas introducing cylinder 500 is provided in the through-hole 405. The gas introducing cylinder 500 is provided in the through-hole 405 such that the central axis of the gas introducing cylinder 500 is coaxial with a central axis of the through-hole 405 and a central axis of a through-hole 305 in the heat shield 300. A ring-like first gap 601 is provided between an outer peripheral surface of the base end of the gas introducing cylinder 500 and a peripheral surface of the through-hole 405. The first gap 601 communicates with a connecting hole 403. The first gap 601 has a constant size in a circumferential direction of the gas introducing cylinder 500. An entire base end surface of the gas introducing cylinder 500 is disposed apart from the window 731 in a longitudinal direction of the gas introducing cylinder 500. A second gap 603 is provided between the base end surface and the window 731. The second gap 603 communicates with the first gap 601 and an internal space of the gas introducing cylinder 500.

A flange 513 of the gas introducing cylinder 500 is disposed on an outer peripheral surface of the gas introducing cylinder 500. The flange 513 is mounted to an inner wall 10b of the chamber device 10 and secures the gas introducing cylinder 500 to the inner wall 10b of the chamber device 10.

A front end of the gas introducing cylinder 500 extends toward the through-hole 305 in the heat shield 300. An inner diameter of the gas introducing cylinder 500 is equal to or larger than a diameter of the through-hole 305 in the heat shield 300, and an entire front end surface 509 of the gas introducing cylinder 500 is arranged to face the heat shield 300. The gas introducing cylinder 500 is not inserted into the through-hole 305 in the heat shield 300, but the entire front end surface 509 of the gas introducing cylinder 500 is disposed apart from the heat shield 300. A third gap 605 is provided between the front end surface 509 of the gas introducing cylinder 500 and the heat shield 300.

A pipe 401, a connecting hole 403, a first gap 601, a second gap 603, and an internal space of the gas introducing cylinder 500 form a channel for etching gas supplied from a gas supply device 74 and flowing through the pipe 401 toward the through-hole 305. The gas introducing cylinder 500 receives the etching gas supplied from the gas supply device 74 through the pipe 401, the connecting hole 403, the first gap 601, and the second gap 603. The gas introducing cylinder 500 introduces the supplied etching gas through the through-hole 305 toward the plasma generating region AR over the heat shield 300. The etching gas flows away from the window 731, that is, flows through the internal space of the gas introducing cylinder 500 toward the through-hole 305 in the gas introducing cylinder 500.

4.2 Effect

In this embodiment, the gas introducing cylinder 500 is provided in the internal space of the chamber device 10 on the side opposite to the plasma generating region AR with respect to the heat shield 300, and extends toward the through-hole 305 in the heat shield 300. The entire front end surface 509 of the gas introducing cylinder 500 is arranged to face the heat shield 300.

Thus, the gas introducing cylinder 500 is not inserted into the through-hole 305 in the heat shield 300, and light generated from plasma can be blocked by the heat shield 300. Accordingly, a front end of the gas introducing cylinder 500 is prevented from being irradiated with light. Further, an increase in temperature at the front end of the gas introducing cylinder 500 due to light can be prevented, deposition of tin from residual gas heated by light at the front end of the gas introducing cylinder 500 can be prevented, and accumulation of tin on the front end of the gas introducing cylinder 500 can be prevented. This can prevent interference of observation by an optical unit 700 due to accumulating tin. This can also prevent contamination of structures in the chamber device 10 due to tin falling from the gas introducing cylinder 500.

Accordingly, in the EUV light generating apparatus 100 of this embodiment, the gas introducing cylinder 500 is prevented from being irradiated with light generated from plasma, thereby preventing occurrence of a fault in the chamber device 10 due to accumulating tin.

In this embodiment, the entire front end surface 509 of the gas introducing cylinder 500 is disposed apart from the heat shield 300.

Thus, the third gap 605 may be provided between the front end surface 509 of the gas introducing cylinder 500 and the heat shield 300. Generally, the heat shield 300 is mounted to the inner wall 10b of the chamber device 10, to which the gas introducing cylinder 500 is previously mounted. When the heat shield 300 is mounted, the third gap 605 ensures dimensional tolerance of structures in the chamber device 10 such as the heat shield 300 and the gas introducing cylinder 500, and the chamber device 10 can be more easily assembled than when no dimensional tolerance is ensured. The heat shield 300 is mounted at room temperature, but if the EUV light generating apparatus 100 is driven and the heat shield 300 is irradiated with light and changed in temperature, the heat shield 300 is thermally expanded. In this embodiment, even if the heat shield 300 is thermally expanded, the third gap 605 prevents contact between the front end surface 509 of the gas introducing cylinder 500 and the heat shield 300, thereby preventing damage due to contact.

Figure 8:
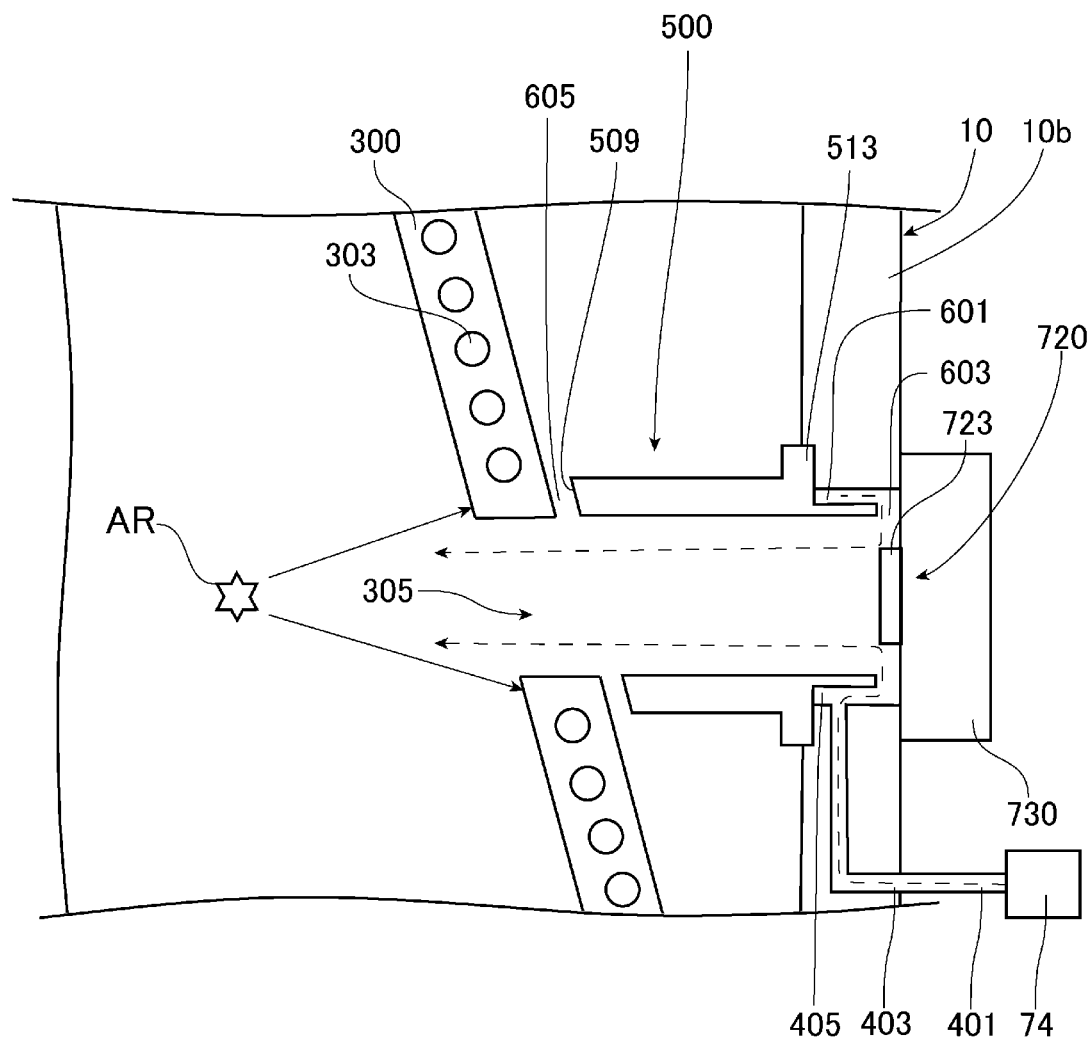
FIG. 8 shows an example of arrangement of the detecting unit in FIG. 7.

The gas introducing cylinder 500 of this embodiment may be integrated into the EUV light generating apparatus 100 even when, as shown in FIG. 8, a light receiving unit 723 held by a holder 730 is provided in the through-hole 405 inside the inner wall 10b of the chamber device 10. As shown in FIG. 6 of the comparative example, the light receiving unit 723 in this case is used for detecting EUV light, plasma, and the like. Like the light receiving unit 723, a light source 711 held by a holder 730 may be provided in the through-hole 405 inside the inner wall 10b of the chamber device 10.

5. Description of EUV Light Generating Apparatus of Embodiment 2

Next, a configuration of an EUV light generating apparatus 100 of Embodiment 2 will be described. Components similar to those described above are denoted by the same reference numerals, and overlapping descriptions are omitted unless otherwise stated.

5.1 Configuration

Figure 9:
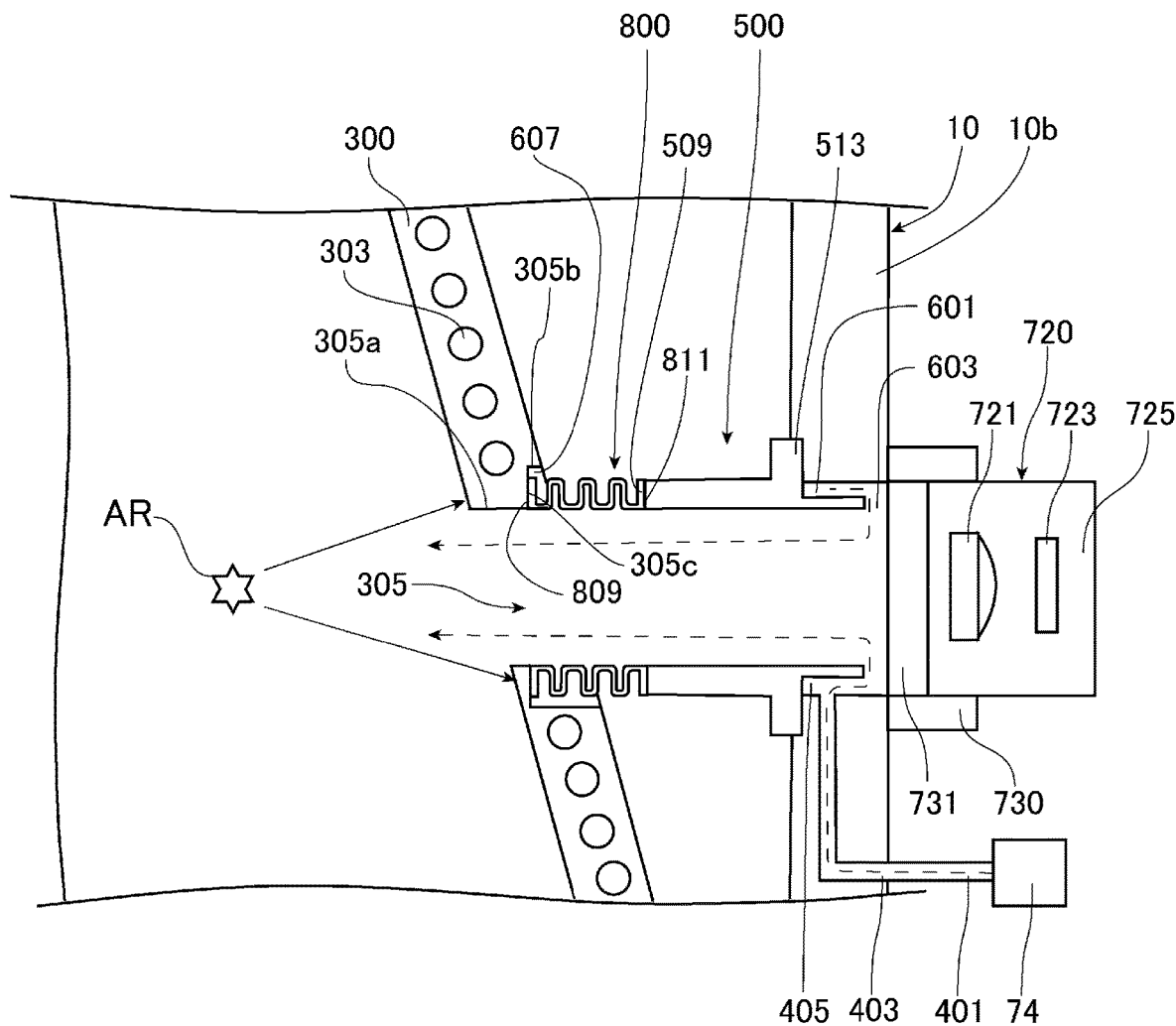
FIG. 9 is an enlarged view of a heat shield, a gas introducing cylinder, a detecting unit, and the surroundings in Embodiment 2.

FIG. 9 is an enlarged view of a heat shield 300, a gas introducing cylinder 500, a detecting unit 720, and the surroundings in this embodiment. In FIG. 9, a control unit CO is not shown as in FIG. 5. In a chamber device 10 of this embodiment, a through-hole 305 in the heat shield 300 includes a small diameter portion 305a and a large diameter portion 305b. The chamber device 10 of this embodiment further includes a connecting cylinder 800 in addition to the configuration of the chamber device 10 of Embodiment 1.

The small diameter portion 305a is located in the heat shield 300 on a side closer to a plasma generating region AR, and the large diameter portion 305b is located in the heat shield 300 on a side closer to an inner wall 10b. The large diameter portion 305b has a larger diameter than the small diameter portion 305a.

The connecting cylinder 800 is made of, for example, metal such as aluminum.

A peripheral surface of the connecting cylinder 800 has a bellows shape, and convex and concave parts of the peripheral surface of the connecting cylinder 800 are alternately disposed in a longitudinal direction of the connecting cylinder 800.

The connecting cylinder 800 is disposed between a step surface 305c between the small diameter portion 305a and the large diameter portion 305b and a front end surface 509 of the gas introducing cylinder 500. The connecting cylinder 800 is disposed such that a central axis of the connecting cylinder 800 is coaxial with a central axis of the gas introducing cylinder 500.

A maximum outer diameter of the bellows-like connecting cylinder 800 is smaller than the diameter of the large diameter portion 305b, and a front end of the connecting cylinder 800 is inserted into the large diameter portion 305b. For example, an outer peripheral surface of the connecting cylinder 800 is disposed 1 mm or less apart from a peripheral surface of the large diameter portion 305b, and a fourth gap 607 is provided between the outer peripheral surface of the connecting cylinder 800 and the peripheral surface of the large diameter portion 305b. An entire front end surface 809 of the connecting cylinder 800 is arranged to face the step surface 305*c*. At least part of the front end surface 809 of the connecting cylinder 800 is secured to the step surface 305*c* by brazing or soldering. The connecting cylinder 800 communicates with the small diameter portion 305*a*. A length of the connecting cylinder 800 is larger than a length of the large diameter portion 305*b*, and the connecting cylinder 800 protrudes from the large diameter portion 305*b* toward the inner wall 10*b* of the chamber device 10. The connecting cylinder 800 communicates with the gas introducing cylinder 500.

The bellows-like connecting cylinder 800 can extend or contract in the longitudinal direction of the connecting cylinder 800. For example, the connecting cylinder 800 extends or contracts 1 mm or more in the longitudinal direction of the connecting cylinder 800. A natural length of the connecting cylinder 800 is longer than a length between the step surface 305*c* and the front end surface 509 of the gas introducing cylinder 500. The connecting cylinder 800 extends toward the front end surface 509 of the gas introducing cylinder 500 with respect to the front end surface 809 of the connecting cylinder 800 secured to the step surface 305*c*.

A minimum inner diameter of the bellows-like connecting cylinder 800 is equal to or larger than the diameter of the small diameter portion 305*a*.

In this embodiment, an inner diameter of the gas introducing cylinder 500 is equal to or larger than the minimum inner diameter of the bellows-like connecting cylinder 800. The entire front end surface 509 of the gas introducing cylinder 500 is arranged to face an entire base end surface 811 of the connecting cylinder 800. The entire front end surface 509 of the gas introducing cylinder 500 is in contact with the entire base end surface 811 of the connecting cylinder 800. The inner diameter of the gas introducing cylinder 500 is smaller than the maximum inner diameter of the bellows-like connecting cylinder 800.

5.2 Effect

In this embodiment, the connecting cylinder 800 is disposed between the step surface 305*c* and the front end surface 509 of the gas introducing cylinder 500. In this embodiment, etching gas is supplied from a gas supply device 74 through a pipe 401, a connecting hole 403, a first gap 601, a second gap 603, an internal space of the gas introducing cylinder 500, an internal space of the connecting cylinder 800, and the through-hole 305 toward the plasma generating region AR.

Thus, with the connecting cylinder 800, a channel for the etching gas extending from the gas introducing cylinder 500 to the through-hole 305 can be a pipe line with less leakage than without the connecting cylinder 800, and the etching gas can more easily flow toward the through-hole 305 than without the connecting cylinder 800. Accordingly, in this embodiment, a flow of the etching gas can more reliably prevent residual gas from entering the internal space of the connecting cylinder 800 and the internal space of the gas introducing cylinder 500 through the through-hole 305 in the heat shield 300 than without the connecting cylinder 800. Even if the residual gas enters the internal spaces, the flow of the etching gas can more reliably prevent the residual gas from traveling to a window 731 than without the connecting cylinder 800.

The etching gas further dilutes the residual gas, and the dilution can more reliably prevent deposition of tin than without the connecting cylinder 800. This further prevents accumulation of tin on inner peripheral surfaces of the connecting cylinder 800 and the gas introducing cylinder 500 and the window 731, thereby further preventing interference of observation by an optical unit 700 due to tin.

In this embodiment, the entire front end surface 809 of the connecting cylinder 800 is arranged to face the step surface 305*c*.

Thus, the connecting cylinder 800 is not inserted into the through-hole 305 in the heat shield 300, and light generated from plasma can be blocked by the heat shield 300. Accordingly, a front end of the connecting cylinder 800 can be prevented from being irradiated with light. Further, an increase in temperature at the front end of the connecting cylinder 800 due to light can be prevented, deposition of tin from residual gas heated by light at the front end of the connecting cylinder 800 can be prevented, and accumulation of tin on the front end of the connecting cylinder 800 can be prevented. This can prevent interference of observation due to accumulating tin even with the connecting cylinder 800. This can also prevent contamination of structures in the chamber device 10 due to tin falling from the front end of the connecting cylinder 800.

In this embodiment, the inner diameter of the connecting cylinder 800 is equal to or smaller than the inner diameter of the gas introducing cylinder 500, and the length of the connecting cylinder 800 is larger than the length of the large diameter portion 305*b*.

Thus, the gas introducing cylinder 500 cannot be inserted into the connecting cylinder 800 and the large diameter portion 305*b*, and the gas introducing cylinder 500 can be disposed apart from the heat shield 300 through the connecting cylinder 800. Thus, a front end of the gas introducing cylinder 500 can be more reliably prevented from being irradiated with light than without the connecting cylinder 800. Further, an increase in temperature at the front end of the gas introducing cylinder 500 due to light can be more reliably prevented, deposition of tin from residual gas heated by light at the front end of the gas introducing cylinder 500 can be more reliably prevented, and accumulation of tin on the front end of the gas introducing cylinder 500 can be more reliably prevented than without the connecting cylinder 800. This can more reliably prevent interference of observation due to accumulating tin than without the connecting cylinder 800.

In this embodiment, the outer diameter of the connecting cylinder 800 is smaller than the diameter of the large diameter portion 305*b*.

Thus, the fourth gap 607 can be provided between the outer peripheral surface of the connecting cylinder 800 and the peripheral surface of the large diameter portion 305*b*. When the heat shield 300 is mounted to the inner wall 10*b* of the chamber device 10, the fourth gap 607 ensures dimensional tolerance of structures in the chamber device 10 such as the heat shield 300 and the connecting cylinder 800, and the chamber device 10 can be more easily assembled than when no dimensional tolerance is ensured. The heat shield 300 is mounted at room temperature, but when the EUV light generating apparatus 100 is driven and the heat shield 300 is irradiated with light and changed in temperature, the heat shield 300 is thermally expanded. Also, the connecting cylinder 800 extends and contracts. In this embodiment, even if the heat shield 300 is thermally expanded and the connecting cylinder 800 extends or contracts, the fourth gap 607 prevents contact between the outer peripheral surface of the connecting cylinder 800 and the peripheral surface of the large diameter portion 305*b*, thereby preventing damage due to contact. The outer peripheral surface of the connecting cylinder 800 may be disposed 1 mm or more apart from the peripheral surface of the large diameter portion 305b.

In this embodiment, the connecting cylinder 800 can extend or contract in the longitudinal direction of the connecting cylinder 800.

Thus, the connecting cylinder 800 can be brought into tight contact with the front end surface 509 of the gas introducing cylinder 500. Accordingly, with the connecting cylinder 800, the channel for the etching gas extending from the gas introducing cylinder 500 to the through-hole 305 can be a pipe line with less leakage than when the connecting cylinder 800 does not extend or contract, and the etching gas can more easily flow toward the through-hole 305 than without the connecting cylinder 800. The connecting cylinder 800 may extend or contract 1 mm or less in the longitudinal direction of the connecting cylinder 800.

When the heat shield 300, to which the connecting cylinder 800 is secured, is mounted to the inner wall 10b of the chamber device 10, the connecting cylinder 800 can be more easily disposed between the step surface 305c and the front end surface 509 of the gas introducing cylinder 500 due to contraction of the connecting cylinder 800, and can be more easily brought into tight contact with the front end surface 509 of the gas introducing cylinder 500 due to extension of the connecting cylinder 800 than when the connecting cylinder 800 does not extend or contract. Even with a narrow space between the step surface 305c and the front end surface 509 of the gas introducing cylinder 500, the connecting cylinder 800 can be more easily disposed between the step surface 305c and the front end surface 509 of the gas introducing cylinder 500 due to extension or contraction of the connecting cylinder 800 than when the connecting cylinder 800 does not extend or contract. Even with a narrow space between the step surface 305c and the front end surface 509 of the gas introducing cylinder 500, the connecting cylinder 800 can be disposed in the space, thereby reducing a size of the chamber device 10.

Even if the heat shield 300 is shifted from its original mounted position in the longitudinal direction of the connecting cylinder 800 when mounted to the inner wall 10b of the chamber device 10, the connecting cylinder 800 can be brought into tight contact with the front end surface 509 of the gas introducing cylinder 500 due to extension or contraction.

In this embodiment, the connecting cylinder 800 extends toward the front end surface 509 of the gas introducing cylinder 500.

Thus, the connecting cylinder 800 can be brought into tight contact with the front end surface 509 of the gas introducing cylinder 500. Accordingly, a pipe line, with less leakage, which is a channel for the etching gas extending from the gas introducing cylinder 500 to the through-hole 305, can be more easily disposed than when the connecting cylinder 800 does not extend toward the front end surface 509 of the gas introducing cylinder 500.

In this embodiment, at least part of the front end surface 809 of the connecting cylinder 800 is secured to the step surface 305c.

Thus, the heat shield 300, to which the connecting cylinder 800 that extends or contracts is secured, can be mounted to the chamber device 10. Accordingly, the chamber device 10 can be more easily assembled than when the heat shield 300, to which no connecting cylinder 800 is mounted, is mounted to the inner wall 10b of the chamber device 10, and then the connecting cylinder 800 is disposed in a narrow space between the step surface 305c and the front end surface 509 of the gas introducing cylinder 500.

In this embodiment, the front end surface 809 of the connecting cylinder 800 need not be previously secured to the step surface 305c. In this case, for example, the heat shield 300 is mounted to the inner wall 10b of the chamber device 10, and then the connecting cylinder 800 is mounted between the step surface 305c and the front end surface 509 of the gas introducing cylinder 500. In this case, the connecting cylinder 800 can be easily disposed between the step surface 305c and the front end surface 509 of the gas introducing cylinder 500 due to contraction of the connecting cylinder 800, and can be easily brought into tight contact with the step surface 305c and the front end surface 509 of the gas introducing cylinder 500 due to extension of the connecting cylinder 800. The connecting cylinder 800 can be adjusted in radial position.

The connecting cylinder 800 of this embodiment may be combined with the configuration of the first embodiment. The connecting cylinder 800 need only be disposed between the outer peripheral surface of the heat shield 300 arranged to face the inner wall 10b of the chamber device 10 and the front end surface 509 of the gas introducing cylinder 500. The connecting cylinder 800 communicates with the through-hole 305. At least part of the front end surface 809 of the connecting cylinder 800 may be arranged to face an outer peripheral surface of the heat shield 300, and may be secured to the outer peripheral surface of the heat shield 300.

Figure 10:
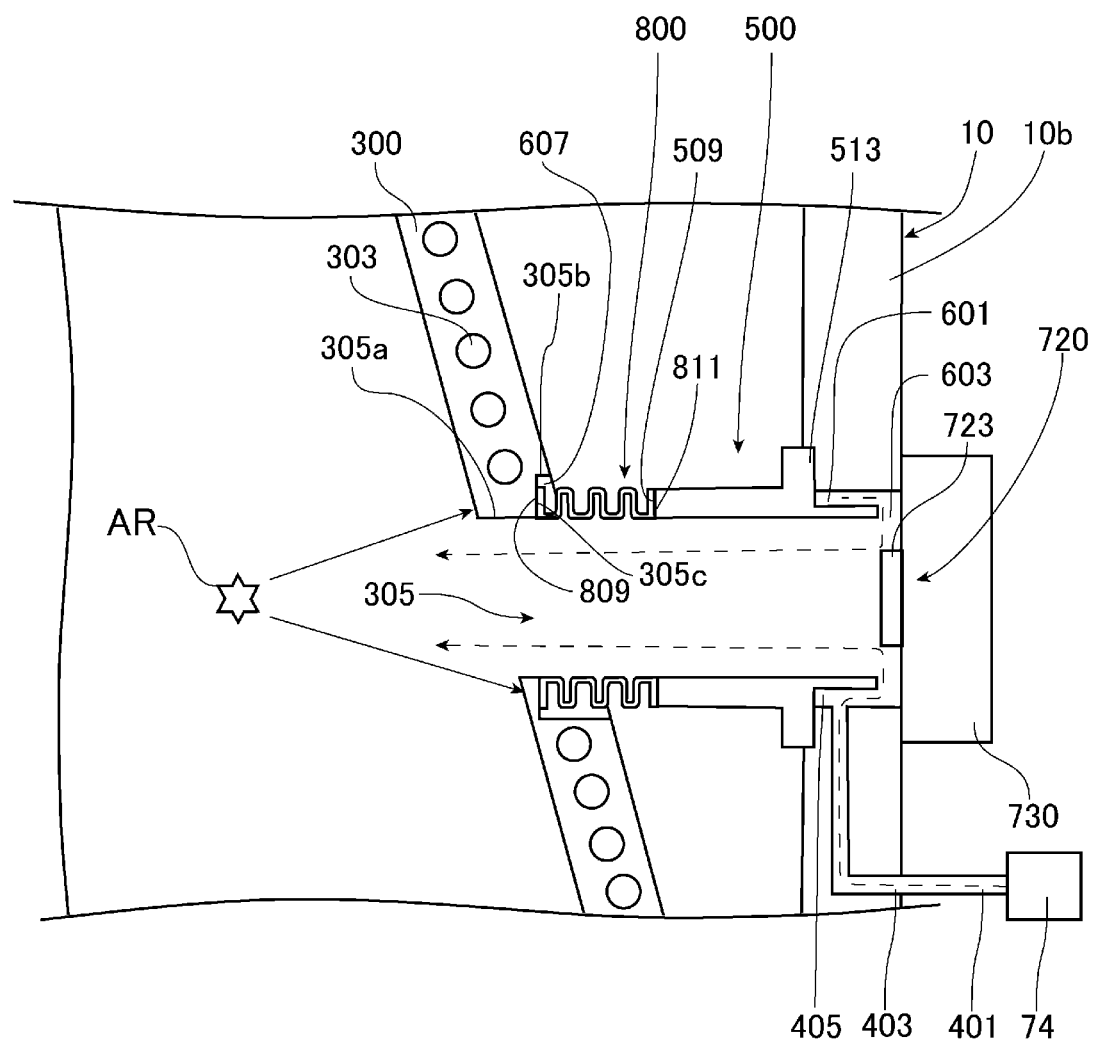
FIG. 10 shows an example of arrangement of the detecting unit in FIG. 9.

The gas introducing cylinder 500 of this embodiment can be integrated into the EUV light generating apparatus 100 even when, as shown in FIG. 10, a light receiving unit 723 held by a holder 730 is provided in a through-hole 405 inside the inner wall 10b of the chamber device 10. As shown in FIG. 6 of the comparative example, the light receiving unit 723 in this case is used for detecting EUV light, plasma, and the like. Like the light receiving unit 723, a light source 711 held by a holder 730 may be provided in the through-hole 405 inside the inner wall 10b of the chamber device 10.

6. Description of EUV Light Generating Apparatus of Embodiment 3

Next, a configuration of an EUV light generating apparatus 100 of Embodiment 3 will be described. Components similar to those described above are denoted by the same reference numerals, and overlapping descriptions are omitted unless otherwise stated.

6.1 Configuration

Figure 11:
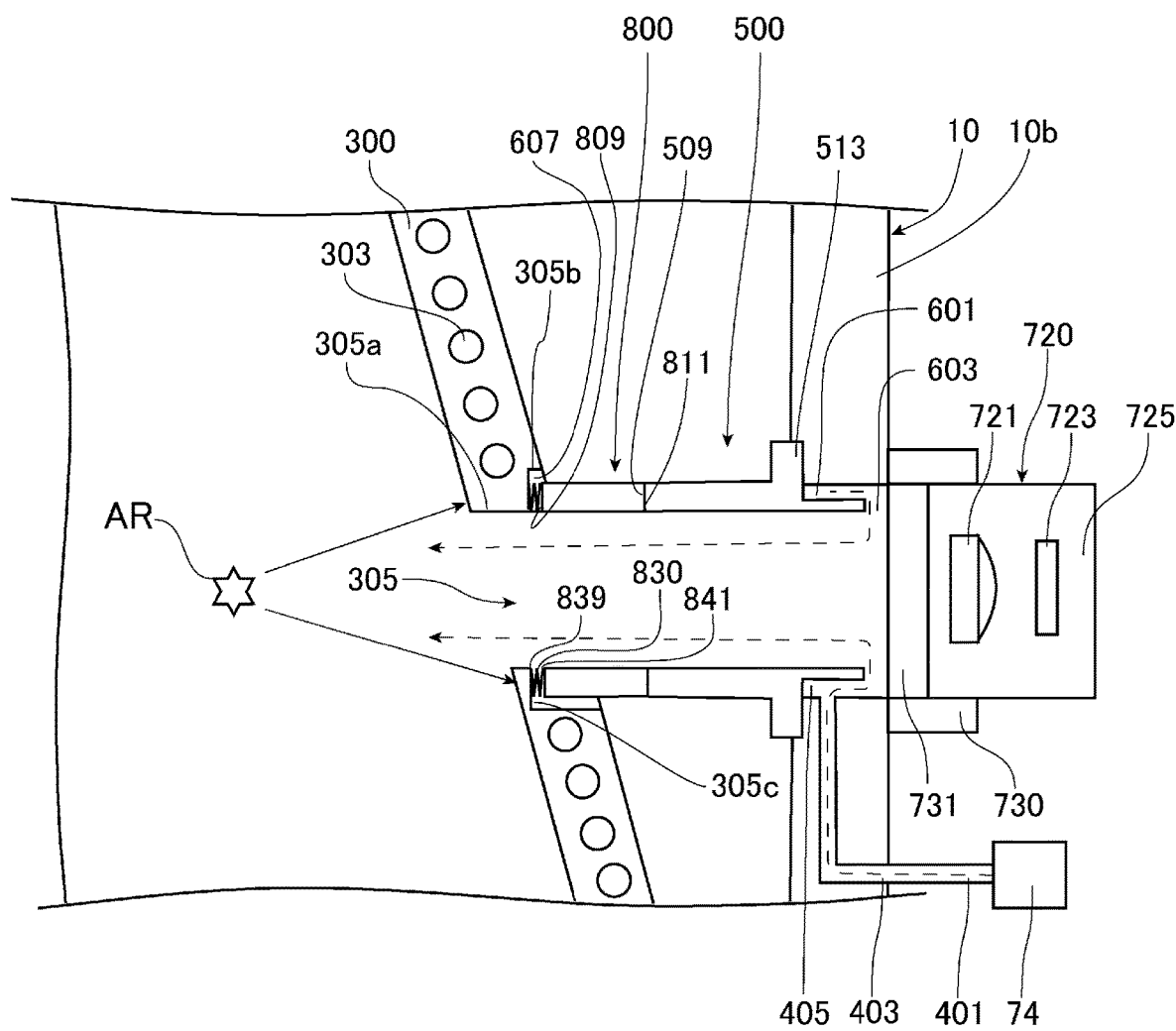
FIG. 11 is an enlarged view of a heat shield, a gas introducing cylinder, a detecting unit, and the surroundings in Embodiment 3.

FIG. 11 is an enlarged view of a heat shield 300, a gas introducing cylinder 500, a detecting unit 720, and the surroundings in this embodiment. In FIG. 11, a control unit CO is not shown as in FIG. 5. In a chamber device 10 of this embodiment, a configuration of a connecting cylinder 800 is different from the configuration of the connecting cylinder 800 of Embodiment 2. The chamber device 10 of this embodiment includes a pressing member 830 in addition to the configuration of the chamber device 10 of Embodiment 2.

A peripheral surface of the connecting cylinder 800 of this embodiment is smooth. An outer diameter of the connecting cylinder 800 is smaller than a diameter of a large diameter portion 305b, and a front end of the connecting cylinder 800 is inserted into the large diameter portion 305b. For example, an outer peripheral surface of the connecting cylinder 800 is disposed 1 mm or less apart from a peripheral surface of the large diameter portion 305b, and a fourth gap 607 is provided between the outer peripheral surface of the connecting cylinder 800 and the peripheral surface of the large diameter portion 305b. The connecting cylinder 800 communicates with a small diameter portion 305a. A length of the connecting cylinder 800 is larger than a length of the large diameter portion 305b, and the connecting cylinder 800 protrudes from the large diameter portion 305b toward an inner wall 10b of the chamber device 10. An entire base end surface 811 of the connecting cylinder 800 is arranged to face an entire front end surface 509 of the gas introducing cylinder 500, and is pressed by the pressing member 830 to be brought into tight contact with the entire front end surface 509 of the gas introducing cylinder 500. The connecting cylinder 800 communicates with the gas introducing cylinder 500.

An inner diameter of the connecting cylinder 800 is equal to or larger than a diameter of the small diameter portion 305a. The inner diameter of the connecting cylinder 800 is equal to or smaller than an inner diameter of the gas introducing cylinder 500.

The pressing member 830 is disposed between a step surface 305c and a front end surface 809 of the connecting cylinder 800. The pressing member 830 is disposed such that a central axis of the pressing member 830 is coaxial with a central axis of the gas introducing cylinder 500. The pressing member 830 presses the connecting cylinder 800 toward the gas introducing cylinder 500. The pressing member 830 is a spring member configured to extend or contract in a longitudinal direction of the pressing member 830. The spring member has, for example, a ring shape. For example, the pressing member 830 extends or contracts 1 mm or more in the longitudinal direction of the pressing member 830. The pressing member 830 extends toward the front end surface 509 of the gas introducing cylinder 500 with respect to a front end of the pressing member 830.

A diameter of the pressing member 830 is smaller than the diameter of the large diameter portion 305b, and the pressing member 830 is inserted into the large diameter portion 305b. For example, an outer peripheral surface of the pressing member 830 is disposed 1 mm or less apart from the peripheral surface of the large diameter portion 305b, and the fourth gap 607 is provided between the outer peripheral surface of the pressing member 830 and the peripheral surface of the large diameter portion 305b. An entire front end surface 839 of the pressing member 830 is arranged to face the step surface 305c. At least part of the front end surface 839 of the pressing member 830 is secured to the step surface 305c by soldering or the like. A length of the pressing member 830 is smaller than the length of the large diameter portion 305b. At least part of a base end surface 841 of the pressing member 830 is secured to the front end surface 809 of the connecting cylinder 800 by soldering or the like.

An inner diameter of the pressing member 830 is equal to or larger than the diameter of the small diameter portion 305a. The inner diameter of the pressing member 830 is equal to or smaller than the inner diameter of the connecting cylinder 800.

6.2 Effect

In this embodiment, the pressing member 830 presses the connecting cylinder 800 toward the gas introducing cylinder 500.

Thus, the connecting cylinder 800 can be brought into tight contact with the front end surface 509 of the gas introducing cylinder 500. Accordingly, a channel for etching gas extending from the gas introducing cylinder 500 to a through-hole 305 can be a pipe line with less leakage than without pressing by the pressing member 830, and the etching gas can more easily flow toward the through-hole 305 than without the pressing member 830.

In this embodiment, the pressing member 830 is the spring member configured to extend or contract in the longitudinal direction of the pressing member 830.

Thus, a typical cylindrical connecting cylinder 800 can be used without any effort to machine the connecting cylinder 800 for extension and contraction.

When the heat shield 300, to which the connecting cylinder 800 is mounted through the pressing member 830, is mounted to the inner wall 10b of the chamber device 10, the connecting cylinder 800 can be more easily disposed between the step surface 305c and the front end surface 509 of the gas introducing cylinder 500 due to contraction of the pressing member 830, and can be more easily brought into tight contact with the front end surface 509 of the gas introducing cylinder 500 due to extension of the pressing member 830 than when the pressing member 830 does not extend or contract. Even with a narrow space between the step surface 305c and the front end surface 509 of the gas introducing cylinder 500, the connecting cylinder 800 can be more easily disposed between the step surface 305c and the front end surface 509 of the gas introducing cylinder 500 due to extension or contraction of the pressing member 830 than when the pressing member 830 does not extend or contract. Even with a narrow space between the step surface 305c and the front end surface 509 of the gas introducing cylinder 500, the connecting cylinder 800 can be disposed in the space, thereby reducing a size of the chamber device 10.

In this embodiment, at least part of the front end surface 839 of the pressing member 830 is secured to the step surface 305c, and at least part of the base end surface 841 of the pressing member 830 is secured to the front end surface 809 of the connecting cylinder 800.

Thus, with the connecting cylinder 800 being secured to the heat shield 300 through the pressing member 830, the heat shield 300 can be mounted to the inner wall 10b. Accordingly, the chamber device 10 can be more easily assembled than when the heat shield 300, to which no connecting cylinder 800 is mounted, is mounted to the inner wall 10b of the chamber device 10, and then the pressing member 830 and the connecting cylinder 800 are disposed in a narrow space between the step surface 305c and the front end surface 509 of the gas introducing cylinder 500.

In this embodiment, the diameter of the pressing member 830 is smaller than the diameter of the large diameter portion 305b.

Thus, the fourth gap 607 can be provided between the pressing member 830 and the peripheral surface of the large diameter portion 305b. When the heat shield 300 is mounted to the inner wall 10b of the chamber device 10, the fourth gap 607 ensures dimensional tolerance of structures in the chamber device 10 such as the heat shield 300 and the pressing member 830, and the chamber device 10 can be more easily assembled than when no dimensional tolerance is ensured. The outer peripheral surface of the pressing member 830 may be disposed 1 mm or more apart from the peripheral surface of the large diameter portion 305b. The pressing member 830 may extend or contract 1 mm or less in the longitudinal direction of the pressing member 830.

The heat shield 300 is mounted at room temperature, but if the EUV light generating apparatus 100 is driven and the heat shield 300 is irradiated with light and changed in temperature, the heat shield 300 is thermally expanded. Also, the pressing member 830 extends or contracts, and the extension or contraction of the pressing member 830 causes the connecting cylinder 800 to move in the longitudinal direction of the connecting cylinder 800. In this embodiment, even if the heat shield 300 is thermally expanded, the pressing member 830 extends or contracts, and the connecting cylinder 800 moves, the fourth gap 607 prevents contact between the outer peripheral surfaces of the connecting cylinder 800 and the pressing member 830 and the peripheral surface of the large diameter portion 305b, thereby preventing damage due to contact.

In this embodiment, the inner diameter of the pressing member 830 is equal to or larger than the diameter of the through-hole 305.

Thus, the pressing member 830 is not inserted into the through-hole 305 in the heat shield 300, and light generated from plasma can be blocked by the heat shield 300. Accordingly, the front end of the pressing member 830 can be prevented from being irradiated with light. Further, an increase in temperature at the front end of the pressing member 830 due to light can be prevented, deposition of tin from residual gas heated by light at the front end of the pressing member 830 can be prevented, and accumulation of tin on the front end of the pressing member 830 can be prevented. This can prevent interference of observation due to accumulating tin even with the pressing member 830. This can also prevent contamination of structures in the chamber device 10 due to tin falling from the front end of the pressing member 830.

In this embodiment, the front end surface 839 of the pressing member 830 need not be previously secured to the step surface 305c. In this case, for example, the heat shield 300 is mounted to the inner wall 10b of the chamber device 10, and then the connecting cylinder 800 and the pressing member 830 are mounted between the step surface 305c and the front end surface 509 of the gas introducing cylinder 500. In this case, the connecting cylinder 800 and the pressing member 830 can be easily disposed between the step surface 305c and the front end surface 509 of the gas introducing cylinder 500 due to contraction of the pressing member 830, and can be easily brought into tight contact with the step surface 305c and the front end surface 509 of the gas introducing cylinder 500 due to extension of the pressing member 830. The connecting cylinder 800 and the pressing member 830 can be adjusted in radial position.

The connecting cylinder 800 and the pressing member 830 of this embodiment may be combined with the configuration of the first embodiment. The connecting cylinder 800 and the pressing member 830 need only be disposed between an outer peripheral surface of the heat shield 300 arranged to face the inner wall 10b of the chamber device 10 and the front end surface 509 of the gas introducing cylinder 500. As in this embodiment, the connecting cylinder 800 communicates with the through-hole 305 through the pressing member 830. At least part of the front end surface 839 of the pressing member 830 may be arranged to face the outer peripheral surface of the heat shield 300, and may be secured to the outer peripheral surface of the heat shield 300.

Figure 12:
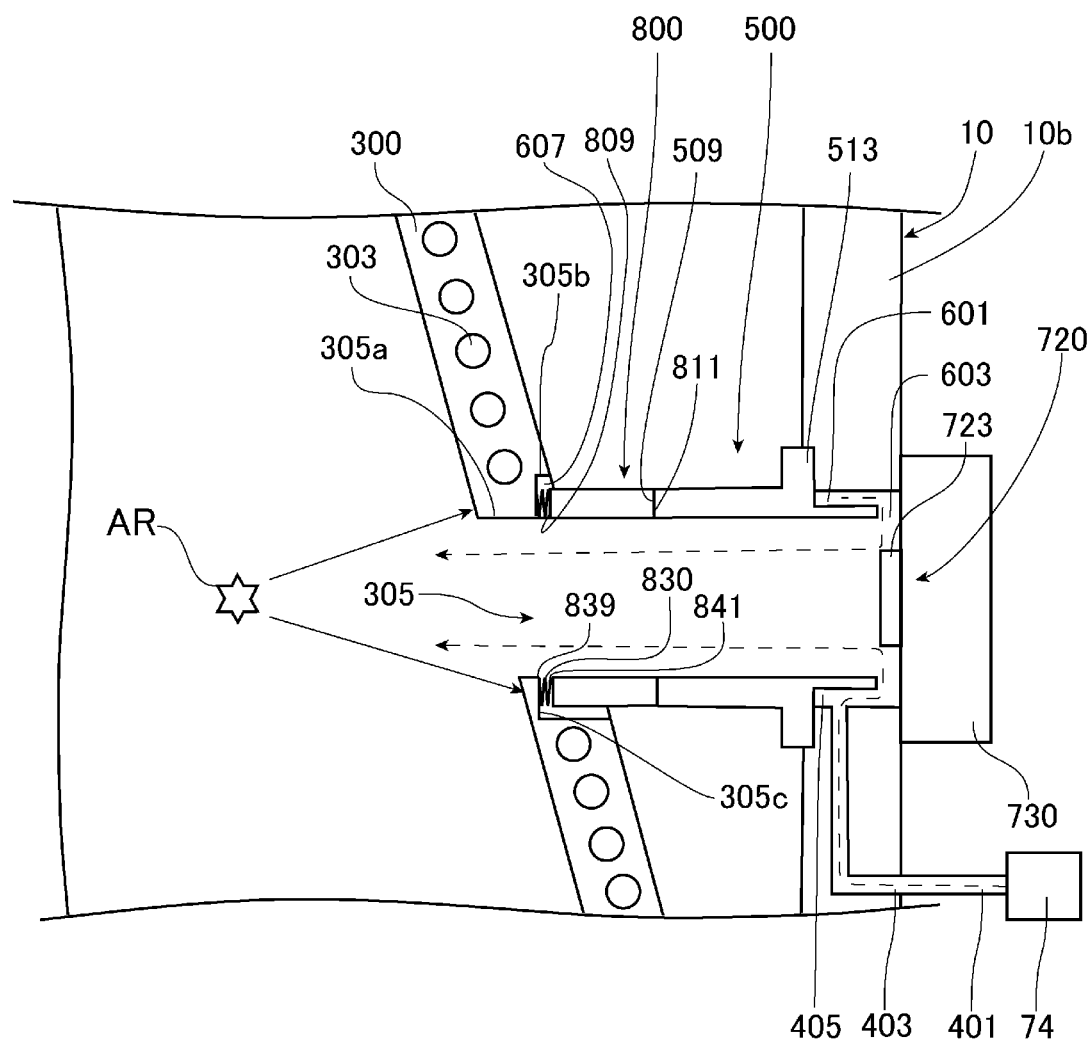
FIG. 12 shows an example of arrangement of the detecting unit in FIG. 11.

The gas introducing cylinder 500 of this embodiment can be integrated into the EUV light generating apparatus 100 even when, as shown in FIG. 12, a light receiving unit 723 held by a holder 730 is provided in a through-hole 405 inside the inner wall 10b of the chamber device 10. As shown in FIG. 6 of the comparative example, the light receiving unit 723 in this case is used for detecting EUV light, plasma, and the like. Like the light receiving unit 723, a light source 711 held by a holder 730 may be provided in the through-hole 405 inside the inner wall 10b of the chamber device 10.

In the embodiments described above, the gas introducing cylinder 500 around the light receiving unit 723 has been described, but the same effect can be obtained for the gas introducing cylinder 500 around the light source unit 710.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generating apparatus comprising:
   a chamber device including an inner wall surrounding a space with a low pressure atmosphere, and a plasma generating region provided in the space and in which plasma is generated from a droplet irradiated with a laser beam;
   a heat shield including a through-hole and a channel portion through which a cooling medium passes, and disposed between the inner wall and the plasma generating region;
   a gas supply device configured to supply gas;
   a gas introducing cylinder provided in the space on a side opposite to the plasma generating region with respect to the heat shield, extending toward the through-hole, and configured to introduce the gas supplied from the gas supply device through the through-hole closer to the plasma generating region than the heat shield; and
   an optical unit optically coupled to the space through an internal space of the gas introducing cylinder and the through-hole,
   wherein the through-hole includes
   a small diameter portion located in the heat shield on a side closer to the plasma generating region, and
   a large diameter portion located in the heat shield on a side closer to the inner wall and having a larger diameter than the small diameter portion,
   the extreme ultraviolet light generating apparatus further comprises a connecting cylinder disposed between a step surface between the small diameter portion and the large diameter portion and the front end surface of the gas introducing cylinder, and
   an entire front end surface of the connecting cylinder is arranged to face the step surface.

2. The extreme ultraviolet light generating apparatus according to claim 1, wherein the entire front end surface of the gas introducing cylinder is arranged to face an entire base end surface of the connecting cylinder, and
   a length of the connecting cylinder is larger than a length of the large diameter portion.

3. The extreme ultraviolet light generating apparatus according to claim 1, wherein an outer diameter of the connecting cylinder is smaller than a diameter of the large diameter portion.

4. The extreme ultraviolet light generating apparatus according to claim 3, wherein an outer peripheral surface of the connecting cylinder is disposed 1 mm or less apart from a peripheral surface of the large diameter portion.

5. The extreme ultraviolet light generating apparatus according to claim 1, wherein the connecting cylinder can extend or contract in a longitudinal direction of the connecting cylinder.

6. The extreme ultraviolet light generating apparatus according to claim 5, wherein the connecting cylinder extends or contracts 1 mm or more in the longitudinal direction of the connecting cylinder.

7. The extreme ultraviolet light generating apparatus according to claim 5, wherein the connecting cylinder extends toward the front end surface of the gas introducing cylinder.

8. The extreme ultraviolet light generating apparatus according to claim 1, wherein at least part of the front end surface of the connecting cylinder is secured to the step surface.

9. The extreme ultraviolet light generating apparatus according to claim 1, further comprising a pressing member disposed between the step surface and the front end surface of the connecting cylinder and configured to press the connecting cylinder toward the gas introducing cylinder.

10. The extreme ultraviolet light generating apparatus according to claim 9, wherein the pressing member is a spring member configured to extend or contract in a longitudinal direction of the pressing member.

11. The extreme ultraviolet light generating apparatus according to claim 9, wherein at least part of a front end surface of the pressing member is secured to the step surface, and at least part of a base end surface of the pressing member is secured to the front end surface of the connecting cylinder.

12. The extreme ultraviolet light generating apparatus according to claim 9, wherein a diameter of the pressing member is smaller than a diameter of the large diameter portion.

13. The extreme ultraviolet light generating apparatus according to claim 12, wherein an outer peripheral surface of the pressing member is disposed 1 mm or less apart from a peripheral surface of the large diameter portion.

14. The extreme ultraviolet light generating apparatus according to claim 1, wherein the chamber device further includes a window disposed in the inner wall,
the gas introducing cylinder is disposed coaxially with the window, and
the optical unit is disposed coaxially with the window outside the inner wall.

15. The extreme ultraviolet light generating apparatus according to claim 1, wherein the optical unit is disposed coaxially with the gas introducing cylinder inside the inner wall.

16. A method of manufacturing an electronic device, the extreme ultraviolet light generating apparatus including:
a chamber device including an inner wall surrounding a space with a low pressure atmosphere, and a plasma generating region provided in the space and in which plasma is generated from a droplet irradiated with a laser beam;
a heat shield including a through-hole and a channel portion through which a cooling medium passes, and disposed between the inner wall and the plasma generating region;
a gas supply device configured to supply gas;
a gas introducing cylinder provided in the space on a side opposite to the plasma generating region with respect to the heat shield, extending toward the through-hole, and configured to introduce the gas supplied from the gas supply device through the through-hole closer to the plasma generating region than the heat shield; and
an optical unit optically coupled to the space through an internal space of the gas introducing cylinder and the through-hole, the through-hole includes a small diameter portion located in the heat shield on a side closer to the plasma generating region, and a large diameter portion located in the heat shield on a side closer to the inner wall and having a larger diameter than the small diameter portion, the extreme ultraviolet light generating apparatus further comprises a connecting cylinder disposed between a step surface between the small diameter portion and the large diameter portion and the front end surface of the gas introducing cylinder, and an entire front end surface of the connecting cylinder is arranged to face the step surface, the method comprising:
generating, using the extreme ultraviolet light generating apparatus, the plasma by irradiating the droplet with the laser beam and emitting extreme ultraviolet light generated from the plasma to an exposure apparatus; and
exposing, using the exposure apparatus, a photosensitive substrate to the extreme ultraviolet light to manufacture an electronic device.

* * * * *